US012754219B2

(12) United States Patent
Tsuchi

(10) Patent No.: US 12,754,219 B2
(45) Date of Patent: Oct. 6, 2026

(54) VOLTAGE DETECTION CIRCUIT, DISPLAY DRIVER, AND DISPLAY DEVICE

(71) Applicant: ROHM Co., Ltd., Kyoto (JP)

(72) Inventor: Hiroshi Tsuchi, Kyoto (JP)

(73) Assignee: ROHM Co., Ltd., Kyoto (JP)

( * ) Notice: Subject to any disclaimer, the term of this patent is extended or adjusted under 35 U.S.C. 154(b) by 0 days.

(21) Appl. No.: 19/243,621

(22) Filed: Jun. 19, 2025

(65) Prior Publication Data

US 2026/0002966 A1 Jan. 1, 2026

(30) Foreign Application Priority Data

Jun. 28, 2024 (JP) ................................ 2024-105378

(51) Int. Cl.

| | |
|---|---|
| ***G09G 5/00*** | (2006.01) |
| ***G01R 19/165*** | (2006.01) |
| ***G09G 3/00*** | (2006.01) |

(52) U.S. Cl.

CPC . *G01R 19/16519* (2013.01); *G01R 19/16557* (2013.01); *G09G 3/006* (2013.01)

(58) Field of Classification Search

CPC ........ G01R 19/16519; G01R 19/16557; G09G 3/006; G06F 3/04166; H03F 1/308; H03F 3/3022; H03F 2200/91; H03K 17/962; H03K 2217/960735; G05F 3/205; G05F 3/262

USPC .......................................................... 345/204

See application file for complete search history.

(56) References Cited

U.S. PATENT DOCUMENTS

2002/0186072 A1* 12/2002 Mano .................... H03L 7/0995 327/538
2016/0161532 A1* 6/2016 Sugiura .................... H03K 5/24 327/109
2019/0267980 A1* 8/2019 Oikawa ............ G01R 19/16519
2024/0353452 A1* 10/2024 Xue ................... G01R 19/2503

FOREIGN PATENT DOCUMENTS

JP 2000275610 10/2000
JP 2006332793 12/2006

* cited by examiner

*Primary Examiner* — Jennifer T Nguyen
(74) *Attorney, Agent, or Firm* — JCIPRNET

(57) ABSTRACT

A voltage detection circuit includes: a self-bias unit, generating a self-bias voltage based on a reference voltage; and detection units, comparing magnitudes of each voltages as a detection target and a reference voltage, and outputting first to $n^{th}$ voltage detection signals indicating whether the voltage is higher than the reference voltage. Each detection units includes: fifth and sixth transistors, respective drains being connected, and, with respective gates receiving one of the voltages, the fifth and sixth transistors outputting a voltage generated at the respective drains as one of the voltage detection signals; seventh and eighth transistors, respectively supplying a current corresponding to the self-bias voltage to the fifth and sixth transistors. The voltage detection circuit includes a current source transistor, causing an operating current based on a bias voltage received by the gate to flow through the self-bias unit and the detection units.

13 Claims, 15 Drawing Sheets

| | | First W/L size ratio | Second W/L size ratio | Third W/L size ratio |
|---|---|---|---|---|
| Transistor | 13A | Normal | Normal | Normal |
| | 13a | Normal | Small | – |
| | 13b | Normal | – | Large |
| Output signal | | (Voa, Vob) | Voa | Vob |
| Threshold voltage | | Vref | Vrafa(<Vref) | Vrafb(>Vref) |

VOLTAGE DETECTION CIRCUIT, DISPLAY DRIVER, AND DISPLAY DEVICE

CROSS-REFERENCE TO RELATED APPLICATION

This application claims the priority benefit of Japan application serial no. 2024-105378, filed on Jun. 28, 2024. The entirety of the above-mentioned patent application is hereby incorporated by reference herein and made a part of this specification.

BACKGROUND

Technical Field

The invention relates to a voltage detection circuit, a display driver including the voltage detection circuit, and a display device.

Description of Related Art

Currently, a display device of an active matrix driving type including: a display panel using liquid crystal or organic EL; and a source driver and a gate driver for driving the display panel are generally known.

On the display panel, multiple data lines extending respectively in the vertical direction of a two-dimensional screen, and multiple gate lines extending respectively in the horizontal direction of the two-dimensional screen are arranged to intersect on an insulating transparent substrate such as glass or plastic. Furthermore, at respective intersections of the multiple data lines and the multiple gate lines, pixel units connected to the data lines and the gate lines are formed. The gate driver supplies gate selection signals sequentially to each of the gate lines of the display panel. Then, the source driver supplies multiple output signals having voltage values corresponding to the brightness levels of respective pixels based on the video signal to respective data lines, thereby displaying an image based on the video signal on the display panel.

Meanwhile, in recent years, display panels have been advancing toward higher resolution, and as the pixel pitch is reduced, the wiring width and the wiring spacing are also reduced, which increases the risk of failure. Therefore, especially for automotive display panels, there is an increasing demand for having a fault detection function that promptly detect abnormalities in the display panel to avoid stuck display, that is, video freezing.

Therefore, a liquid crystal display device including such a fault detection function has been proposed (see, for example, FIG. 1 and FIG. 4 of Patent Document 1 (Japanese Patent Application Laid-open No. 2000-275610)). In such a liquid crystal display device, a comparator (COMP1, COMP2) as a voltage detection circuit compares the output signal that the source driver outputs to the data line with a predetermined reference voltage, and outputs the comparison result as a discrimination signal indicating whether a voltage abnormality has occurred.

Additionally, a self-bias type differential amplifier type comparison circuit has been proposed to serve as such a voltage detection circuit (see FIG. 1 of Patent Document 2 (Japanese Patent Application Laid-open No. 2006-332793)).

FIG. 1 is a circuit diagram showing the configuration of a comparison circuit 10 described in FIG. 1 of Patent Document 2.

As shown in FIG. 1, the comparison circuit 10 includes P-channel type transistors 10*a* to 10*c*, and N-channel type transistors 10*d* to 10*f*.

The transistor 10*a* receives a power voltage Vcc at the source, and the drain of the transistor 10*a* is connected to the source of each of the transistors 10*b* and 10*c* via an internal node Vsp. The drains of the transistors 10*b* and 10*d* are connected to each other through an internal node Vrefb, and the respective gates of the transistors 10*b* and 10*d* receive a predetermined reference voltage Vref. The internal node Vrefb is connected to the respective gates of the transistors 10*a* and 10*f*. In the transistors 10*c* and 10*e*, the respective drains are connected to each other, and an input signal Vin is received at the respective gates. In the transistor 10*f*, the source receives a ground voltage Vss, and the drain is connected to the source of each of the transistors 10*d* and 10*e* via an internal node Vsn.

It should be noted that the comparison circuit 10 is designed so that the transistors 10*a* to 10*f* are simultaneously in the ON state. With such configuration, the comparison circuit 10 outputs the voltage generated at the internal node where the drains of the transistors 10*c* and 10*e* are connected as an output signal Vout0 indicating whether the voltage level of the input signal Vin is higher than the reference voltage Vref.

Meanwhile, within the source driver, in addition to the logic power voltage for operating the digital circuit, multiple power circuits that generate multiple analog power voltages for generating signal voltages supplied to data lines of the display panel and gate selection signals supplied to gate lines are provided. At this time, if a malfunction occurs in the power circuit causing the voltage value of each power voltage to increase or decrease beyond the defined level, normal display cannot be performed.

Therefore, similar to the multiple output signals output from the source driver, it is desired to perform voltage detection individually for multiple power voltages including the logic power voltage and various analog power voltages to check whether a voltage abnormality has occurred.

However, if a self-bias type differential amplifier type comparison circuit as shown in FIG. 1 of Japanese Patent Application Laid-Open Publication No. 2006-332793 is provided for each number of voltages that are detection targets for such voltage detection, the circuit scale becomes large, resulting in increased power consumption.

In addition, in the configuration of the comparison circuit shown in FIG. 1 of Patent Document 2, since all transistors connected between the power voltage Vcc and the ground voltage Vss operate in the ON state, a problem arises that the static current consumption increases as the amplitude of the power voltage (Vcc-Vss) becomes larger.

Furthermore, according to the configuration of the comparison circuit shown in FIG. 1 of Patent Document 2, the amplitude of the output signal Vout0 is limited to the range between the voltage of the internal node Vsp and the voltage of the internal node Vsn. At this time, the limitation can be eliminated by providing a circuit at the subsequent stage of the comparison circuit that increases the amplitude of the output signal of the comparison circuit to the amplitude of the power voltage (Vcc-Vss), but the power consumption increases due to the addition of the circuit, and the circuit area also increases due to the addition of the circuit.

SUMMARY

A voltage detection circuit according to an aspect of the invention is provided for comparing magnitudes of a reference voltage and each of first to $n^{th}$ voltages, n being an integer of 2 or more, and outputting first to $n^{th}$ voltage detection signals indicating whether the respective first to $n^{th}$ voltages are higher than the reference voltage. The voltage detection circuit includes: a self-bias unit, receiving the reference voltage, and generating a self-bias voltage based on the reference voltage; and first to $n^{th}$ detection units, individually receiving the first to $n^{th}$ voltages, and individually outputting the first to $n^{th}$ voltage detection signals. The self-bias unit includes: a first transistor and a second transistor, having mutually different conductive types, wherein respective drains of the first and second transistors are connected with each other via a first node, and the first and second transistors generate, as the self-bias voltage, a voltage occurring at the first node by receiving the reference voltage at respective gates of the first and second transistors; a third transistor, receiving, at a gate of the third transistor, the self-bias voltage, and supplying a current corresponding to a difference between a voltage at a source of the third transistor and the self-bias voltage to a source of the first transistor; and a fourth transistor, receiving, at a gate of the fourth transistor, the self-bias voltage, and supplying a current corresponding to a voltage at a source of the fourth transistor and the self-bias voltage to a source of the second transistor. Each of the first to $n^{th}$ detection unit includes: a fifth transistor and a sixth transistor, having mutually different conductive types, wherein respective drains of the fifth and sixth transistors are connected, and, with respective gates of the fifth and sixth transistors receiving one of the first to $n^{th}$ voltages, the fifth and sixth transistors output a voltage generated at the respective drains as one of the first to $n^{th}$ voltage detection signals; a seventh transistor, receiving, at a gate of the seventh transistor, the self-bias voltage, and supplying a current corresponding to a difference between a voltage at a source of the seventh transistor and the self-bias voltage to a source of the fifth transistor; and an eighth transistor, receiving, at a gate of the eighth transistor, the self-bias voltage, and supplying a current corresponding to a difference between a voltage at a source of the eighth transistor and the self-bias voltage to a source of the sixth transistor. The voltage detection circuit further includes: at least one current source transistor, receiving a bias voltage at a gate of the current source transistor, and generating a drain current based on a difference between a voltage of a source of the current source transistor and the bias voltage as an operating current that flows through the first to fourth transistors of the self-bias unit and the fifth to eighth transistors of each of the first to $n^{th}$ detection units.

A display driver according to another aspect of the invention is a driver for driving a display panel in which multiple data lines and multiple gate lines are disposed to intersect. The display driver includes: a data driver, generating multiple drive signals based on a video signal and supplying the drive signals to the data lines; a gate driver, supplying a gate selection signal to each of the gate lines; a power circuit, generating a plurality of power voltages used by the data driver and the gate driver; the voltage detection circuit; a resistor string receiving at least one of the plurality of power voltages as a detection target, and generating, as first to $n^{th}$ voltages, voltages obtained by respectively dividing the received power voltage; and a control unit, determining whether a voltage abnormality occurs in the power voltage based on the first to $n^{th}$ voltage detection signals output from the voltage detection circuit, and stopping an operation of the data driver and the gate driver in a case where it is determined that the voltage abnormality occurs.

A display device according to another aspect of the invention includes: a display panel, in which multiple data lines and multiple gate lines are disposed to intersect; and a display driver, driving the display panel. The display panel includes: a data driver, generating multiple drive signals based on a video signal and supplying the drive signals to the data lines; a gate driver, supplying a gate selection signal to each of the gate lines; a power circuit, generating a plurality of power voltages used by the data driver and the gate driver; the voltage detection circuit; a resistor string individually receiving at least one of the plurality of power voltages as a detection target, and generating, as first to $n^{th}$ voltages, voltages obtained by respectively dividing the received power voltage; and a control unit, determining whether a voltage abnormality occurs in the power voltage based on the first to $n^{th}$ voltage detection signals output from the voltage detection circuit, and stopping an operation of the data driver and the gate driver in a case where it is determined that the voltage abnormality occurs.

DESCRIPTION OF THE EMBODIMENTS

Embodiments of the disclosure provide a battery management system and a battery management method that align timings of performing analog-to-digital conversion on voltages measured by multiple circuits.

Example 1

Figure 2:
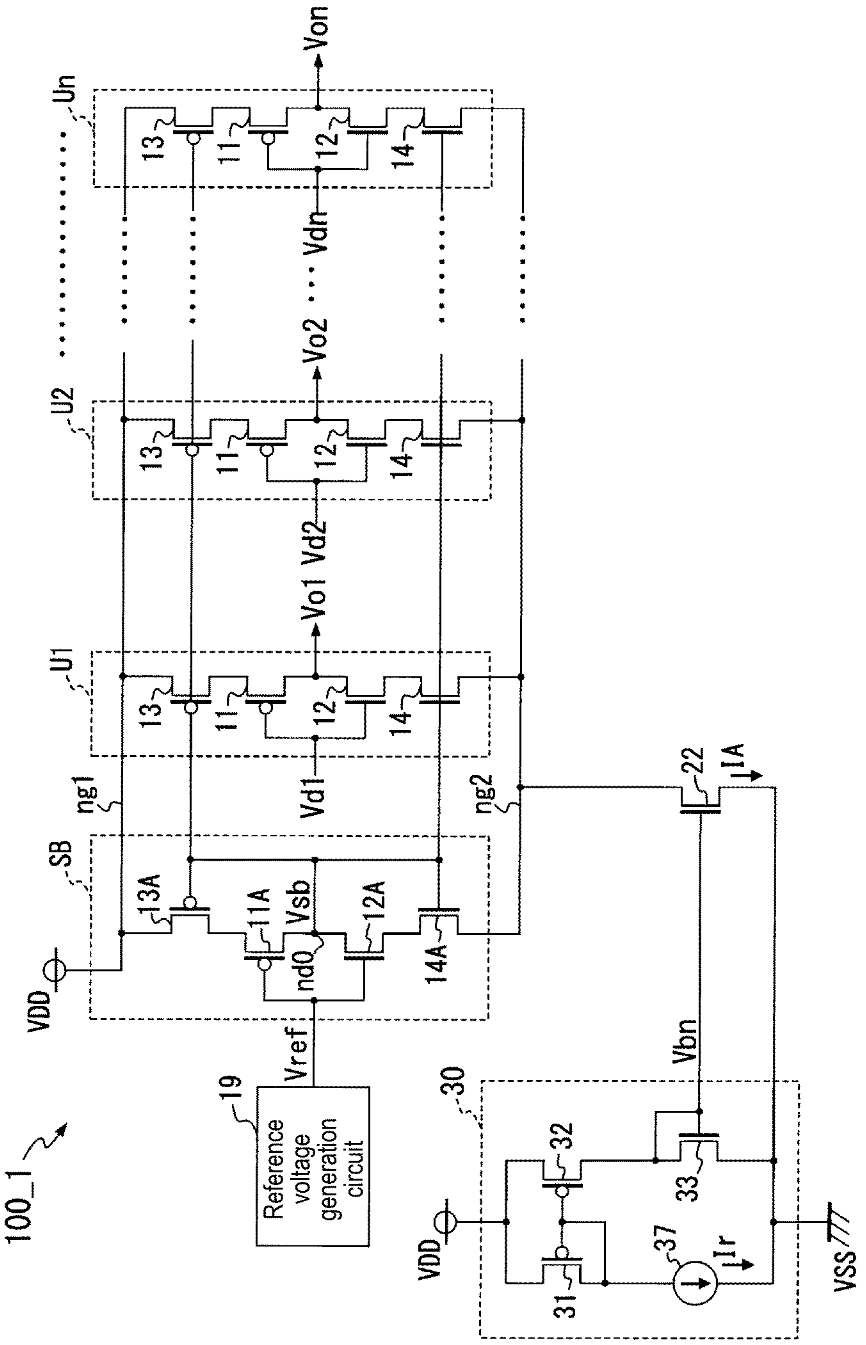
FIG. 2 is a circuit diagram showing the configuration of a voltage detection circuit 100_1 according to the first example.

FIG. 2 is a circuit diagram showing the configuration of a voltage detection circuit 100_1 according to the first example according to the invention.

The voltage detection circuit 100_1 is supplied with a power voltage VSS (for example, 0V) as the reference and a main power voltage VDD, receives voltages Vd1 to Vdn of n systems (where n is an integer of 2 or more) as detection target voltages, and individually compares the magnitudes of each of the voltages Vd1 to Vdn and a predetermined reference voltage Vref. Through the comparison, the voltage detection circuit 100_1 individually detects whether each of the voltages Vd1 to Vdn is higher than the reference voltage Vref, and outputs voltage detection signals Vo1 to Von that indicate the detection results in a binary form (logic values L, H).

As shown in FIG. 2, the voltage detection circuit 100_1 is a modification of a self-bias type amplifier circuit, and includes a reference voltage generation circuit 19, a self-bias unit SB, and detection units U1 to Un.

Furthermore, the voltage detection circuit 100_1 includes an N-channel type transistor 22 serving as a current source, and a bias circuit 30.

The reference voltage generation circuit 19 includes, for example, a bandgap reference circuit, etc., and generates an absolute reference voltage that does not depend on the main power voltage VDD, an environmental temperature, or a manufacturing process, and supplies the absolute reference voltage as the reference voltage Vref to the self-bias unit SB.

The self-bias unit SB includes P-channel type transistors 11A and 13A, and N-channel type transistors 12A and 14A.

In the transistors 11A and 12A, the gates are connected to each other and receive the reference voltage Vref. Additionally, the drains of the transistors 11A and 12A are connected to the gates of the transistors 13A and 14A, respectively, via a node nd0.

In the transistor 13A, the source is connected to a node ng1, and the drain is connected to the source of the transistor 11A. The node ng1 is arranged as a power node to which the main power voltage VDD is supplied.

In the transistor 14A, the drain is connected to the source of the transistor 12A, and the source is connected to a node ng2.

The respective detection units U1 to Un have the same internal configuration that includes a P-channel type transistor 11, an N-channel type transistor 12, a P-channel type transistor 13, and an N-channel type transistor 14.

The gates of the transistors 11 and 12 are connected to each other, and the drains of the transistors 11 and 12 are connected to each other.

In the transistor 13, the drain is connected to the source of the transistor 11, the gate is connected to the node nd0, and the source is connected to the node ng1. The sources of the transistors 13 included in the respective detection units U1 to Un are jointly connected, together with the source of the transistor 13A of the self-bias unit SB, with the node ng1 to which the main power voltage VDD is supplied.

In the transistor 14, the drain is connected to the source of the transistor 12, the gate is connected to the node nd0, and the source is connected to the node ng2. The sources of the transistors 14 included in the respective detection units U1 to Un are jointly connected, together with the source of the transistor 14A of the self-bias unit SB, with the node ng2.

Here, as shown in FIG. 2, the detection units U1 to Un individually receive voltages Vd1 to Vdn, which are the voltage detection targets, at the junction points of the gates of the transistors 11 and 12 respectively included, and output voltage detection signals Vo1 to Von from the junction points of the drains of the respective transistors 11 and 12.

The self-bias unit SB and each of the detection units U1 to Un share a configuration where four transistors are connected in series between the nodes ng1 and ng2, and the conduction type of each stage of the four transistors is also the same. Furthermore, as a basic configuration, the W/L size ratio of each stage of the four transistors is also the same.

In the transistor 22 as the current source, the drain is connected, as shown in FIG. 2, via the node ng2, to the source of the transistor 14A included in the self-bias unit SB, and to the source of each transistor 14 included in each of the detection units U1 to Un.

In the transistor 22, the source receives the power voltage VSS (for example, 0 volts), and the gate receives a bias voltage Vbn supplied from the bias circuit 30. The transistor 22 generates a drain current of a magnitude corresponding to the bias voltage Vbn, and causes the drain current, as an operating current IA for operating the self-bias unit SB and the detection units U1 to Un, to flow through each of the self-bias unit SB and the detection units U1 to Un.

The reference voltage Vref, the main power voltage VDD, and the power voltage VSS have a following magnitude relationship: The reference voltage Vref is set to a voltage that keeps each of the four transistors 11A, 12A, 13A, and 14A of the self-bias unit SB in an on state and causes a drain current to flow in each transistor.

$$VDD > Vref > VSS$$

The bias circuit 30 includes, as shown in FIG. 2, P-channel type transistors 31 and 32, an N-channel type transistor 33, and a current source 37.

The gate and the drain of the transistor 31 are connected with each other. The transistors 31 and 32 form a current mirror, where the gates are connected to each other and the respective sources receive the main power voltage VDD.

The current source 37 generates a predetermined reference current Ir and supplies the reference current Ir to the drain of the transistor 31 on the input side of the current mirror. At this time, the transistor 32 on the output side of the current mirror supplies a current that copies the reference current Ir to the drain of the transistor 33. In the transistor 33, the drain and the gate are connected to each other, and the source receives the power voltage VSS (for example, 0 volts). In the transistor 33, the drain receives the current supplied from the transistor 32, and at this time, the voltage generated by the drain and the gate are supplied as the bias voltage Vbn to the gate of the transistor 22.

In other words, the bias circuit 30 supplies, as the bias voltage Vbn, a voltage corresponding to the magnitude of the reference current Ir to the gate of the transistor 22 as the current source.

As a result, the transistor 22 generates a drain current of a magnitude corresponding to the bias voltage Vbn, and causes the drain current to flow as an operating current IA to the self-bias unit SB and the detection units U1 to Un.

At this time, the operating current supplied to the self-bias unit SB and the detection units U1 to Un can be controlled to any arbitrary magnitude by using the reference current Ir generated by the current source 37 of the bias circuit 30.

The operation of the voltage detection circuit 100_1 will be described in detail below.

First, the self-bias unit SB generates a self-bias voltage Vsb of a magnitude corresponding to the reference voltage Vref, and supplies the self-bias voltage Vsb to the gates of the transistors 13 and 14 of each of the detection units U1 to Un. Accordingly, the transistors 11A and 12A enter the ON state, and a voltage corresponding to the reference voltage Vref is generated at the node nd0. The self-bias unit SB supplies the voltage generated at the node nd0, as the self-bias voltage Vsb, to the respective gates of the transistors 13A and 14A. Accordingly, both of the transistors 13A and 14A enter the ON state, a bias current based on the voltages of the node ng1 and the node ng2 flows through a path formed by the transistors 13A, 11A, 12A, and 14A, and accordingly, the voltage generated at the node nd0 is generated as the self-bias voltage Vsb. In FIG. 2, the node ng1 is a power node to which the main power voltage VDD is supplied, and the node ng2 becomes a voltage supplied with the operating current IA from the power voltage VSS through the transistor 22. However, if the reference voltage Vref is a voltage near the power voltage VSS, the node ng2 becomes a voltage sufficiently close to the power voltage VSS.

The self-bias unit SB supplies the self-bias voltage Vsb not only to the gate of each of the transistors 13A and 14A, but also to each of the detection units U1 to Un. At this time, the transistor 13 of each of the detection units U1 to Un transmits a bias current of a magnitude corresponding to the self-bias voltage Vsb toward the source of the transistor 11. Furthermore, the transistor 14 of each of the detection units U1 to Un draws a bias current of a magnitude corresponding to the self-bias voltage Vsb from the source of the transistor 12.

Here, in each of the detection units U1 to Un, that is, in a detection unit U(r) (where r is an integer from 1 to n), the transistors 11 and 12 enter the ON state according to a voltage Vd(r) that is received. At this time, in the case where the voltage Vd(r) is higher than the reference voltage Vref, the current drawn by the transistor 14 from the junction point of the drains of the transistors 11 and 12 becomes greater than the current transmitted by the transistor 11 to the junction point. As a result, the voltage at the junction point decreases to reach the voltage of the node ng2, which is sufficiently close to the power voltage VSS (for example, 0 volts). Therefore, the detection unit U(r) outputs a voltage detection signal Vo(r) with the logic value L.

Meanwhile, in the case where the voltage Vd(r) is equal to or lower than the reference voltage Vref, the current drawn by the transistor 14 from the junction point between the drains of the transistors 11 and 12 becomes smaller than the current transmitted by the transistor 11 to the junction point. Accordingly, the voltage at the junction point increases to reach the main power voltage VDD. Consequently, the detection unit U(r) outputs the voltage detection signal Vo(r) with the logic value H.

Figure 3:
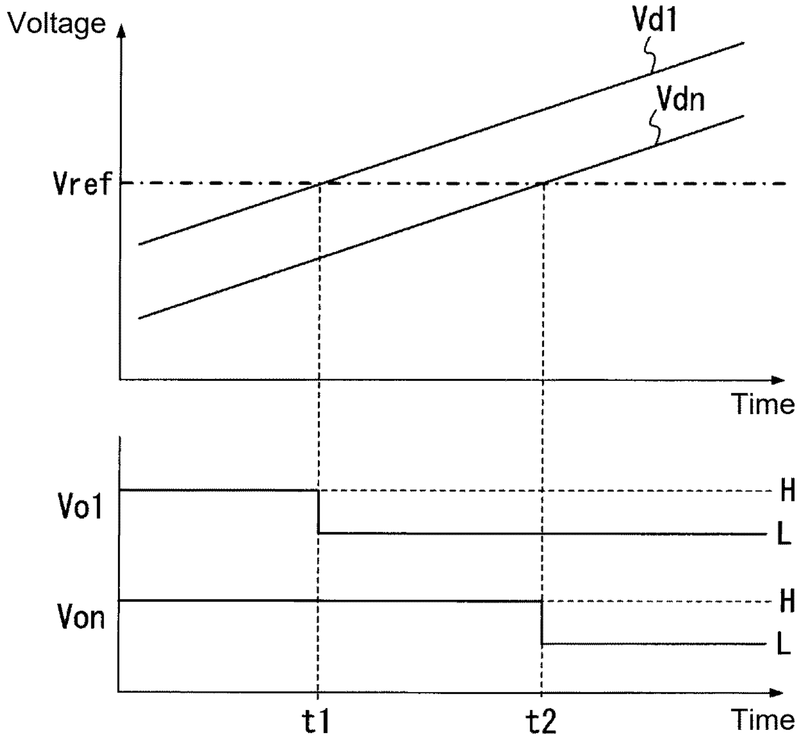
FIG. 3 is a waveform diagram showing an example of waveforms of voltage detection signals Vo1 and Von output by detection units U1 and Un based on voltages Vd1 and Vdn as detection target voltages.

FIG. 3 is a waveform diagram showing an example of waveforms of the voltage detection signals Vo1 and Von respectively output by the detection units U1 and Un, respectively, based on the voltages Vd1 and Vdn (where Vd1>Vdn), which are extracted from the voltages Vd1 to Vdn as the detection target voltages in the voltage detection circuit 100_1 of FIG. 2. In FIG. 3, for the ease of description, an example is described in the case where the voltages Vd1 and Vdn change in conjunction with each other.

Also, in the following examples, including the present example, for ease of description, it is described that the transistors 11A, 12A, 13A, and 14A included in the self-bias unit SB, and the transistors 11, 12, 13, and 14 included in each of the detection units U1 to Un have the same size as those placed at the same positions relative to each other.

As shown in FIG. 3, in the case where the voltage value of the voltage Vd1 becomes equal to or lower than the reference voltage Vref, the voltage detection signal Vo1 with the logic value His output. Here, as shown in FIG. 3, when the voltage value of the voltage Vd1 gradually increases and becomes higher than the reference voltage Vref at a time point t1, the detection unit U1 changes the voltage detection signal Vo1 from a state of the logic value H to the logic value L.

Meanwhile, as shown in FIG. 3, in the case where the voltage value of the voltage Vdn becomes equal to or lower than the reference voltage Vref, the detection unit Un outputs the voltage detection signal Von with the logic value H. In addition, when the voltage value of the voltage Vdn gradually increases and becomes higher than the reference voltage Vref at a time point t2 as shown in FIG. 3, the detection unit Un changes the voltage detection signal Von from the state of the logic value H to the logic value L.

In this way, in the voltage detection circuit 100_1 the first to $n^{th}$ detection units U1 to Un receives the first to $n^{th}$ voltages Vd1 to Vdn as the detection target voltages and compares the magnitudes of the reference voltage Vref and each of the first to $n^{th}$ voltages Vd1 to Vdn. Then, the voltage detection circuit 100_1 outputs the first to $n^{th}$ voltage detection signals Vo1 to Von indicating whether each of the first to $n^{th}$ voltages Vd1 to Vdn is higher than the reference voltage Vref.

Here, as shown in FIG. 2, the self-bias unit SB of the voltage detection circuit 100_1 is formed by the first to fourth transistors 11A to 14A as follows. That is, the first transistor 11A and the second transistor 12A are of different conductive types (P-channel type, N-channel type), the respective drains of the first transistor 11A and the second transistor 12A are connected via the first node nd0, and the respective gates of the first transistor 11A and the second transistor 12A receive the reference voltage Vref. Accordingly, the first transistor 11A and the second transistor 12A generate a voltage occurring at the first node nd0 as the self-bias voltage Vsb. The gate of the third transistor 13A receives the self-bias voltage Vsb, the third transistor 13A supplies a current (source current) corresponding to the difference between the voltage at the source of the third transistor 13A and the self-bias voltage Vsb to the source of the first transistor 11A. The gate of the fourth transistor 14A receives the self-bias voltage Vsb, the fourth transistor 14A supplies a current (sink current) corresponding to the difference between the voltage at the source of the fourth transistor 14A and the self-bias voltage Vsb to the source of the second transistor 12A.

Each of the first to $n^{th}$ detection units U1 to Un of the voltage detection circuit 100_1 is formed by fifth to eighth transistors as follows. That is, the fifth transistor 11 and the sixth transistor 12 are of mutually different conductive types, the respective drains are connected, and with the respective gates receiving one of the first to $n^{th}$ voltages Vd1 to Vdn, the fifth transistor 11 and the sixth transistor 12 output the voltage occurring at the respective drains as one of the first to $n^{th}$ voltage detection signals Vo1 to Von. The gate of the seventh transistor 13 receives the self-bias voltage Vsb, the seventh transistor 13 supplies a current (source current) corresponding to the difference between the voltage at the source of the seventh transistor 13 and the self-bias voltage Vsb to the source of the fifth transistor 11. The gate of the eighth transistor 14 receives the self-bias voltage Vsb, the eighth transistor 14 supplies a current (sink current) corresponding to the difference between the voltage at the source of the eighth transistor 14 and the self-bias voltage Vsb to the source of the sixth transistor 12.

In this way, in the voltage detection circuit 100_1, the number of transistors required to compare each of the voltages Vd1 to Vdn of n systems with the reference voltage Vref is the total (4n+9) of 4 for the self-bias unit SB, 4n for the detection units U1 to Un, and 5 for the bias circuit 30 and the transistor 22. That is, in the voltage detection circuit 100_1, the increment of transistors that increases in proportion to the number n of the detection target voltages is 4n. Therefore, according to the voltage detection circuit 100_1, it is possible to reduce the circuit area compared to the case of adopting the comparator shown in FIG. 1 of Patent Document 2, where the increment of transistors that increases in proportion to the number n of the detection target voltages is 6n.

Figure 1:
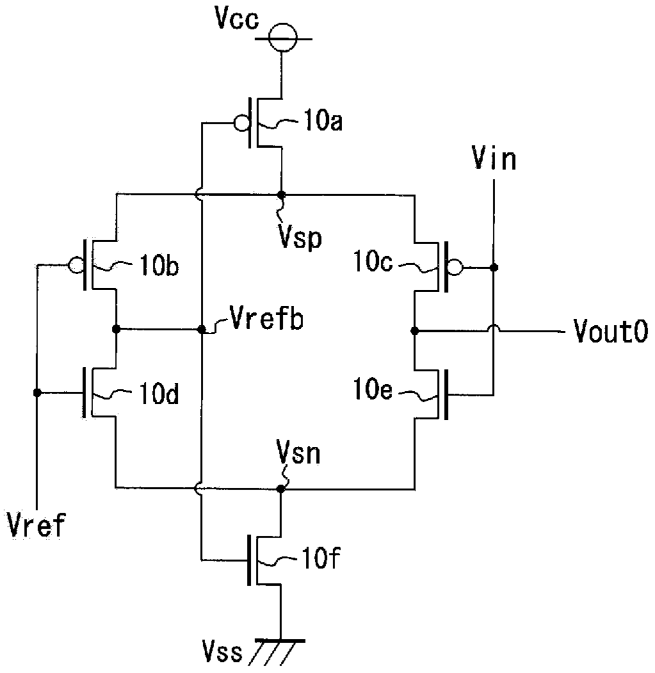
FIG. 1 (Prior Art)
FIG. 1 is a circuit diagram showing the configuration of a conventional self-bias type differential amplifier type comparison circuit 10.

Also, in the voltage detection circuit 100_1, unlike FIG. 1 of Patent Document 2, in the self-bias unit SB, the transistors 13A and 14A that receive at the gates the self-bias voltage Vsb and control the bias current, and in each of the detection units U1 to Un, the transistors 13 and 14 that receive at the gates the self-bias voltage Vsb and control the bias current, are provided separately from each other. As a result, the amplitude of each of the voltage detection signals Vo1 to Von of the detection units U1 to Un can be expanded at maximum from the main power voltage VDD of the node ng1 to the vicinity of the power voltage VSS of the node ng2.

Furthermore, in the voltage detection circuit 100_1, since the operating current IA flowing through the self-bias unit SB and the detection units U1 to Un is generated by the transistor 22 as the current source, the operating current IA can be limited to any arbitrary magnitude regardless of the voltage difference between the main power voltage VDD and the power voltage VSS.

Therefore, even in the case of adopting a high-voltage main power voltage VDD, or in the case of adopting those having a low threshold voltage Vt as the transistors 13A, 14A, 13, 14 that receive the supply of the self-bias voltage Vsb and included in each of the self-bias unit SB and the detection units U1 to Un, it is possible to reduce power consumption because the static current consumption can be reduced.

In the voltage detection circuit 100_1 shown in FIG. 2, the operating current IA flowing through the self-bias unit SB and the detection units U1 to Un is generated on the side of the low-voltage power voltage VSS, but the operating current IA may also be generated on the side of the high-voltage main power voltage VDD.

Figure 4:
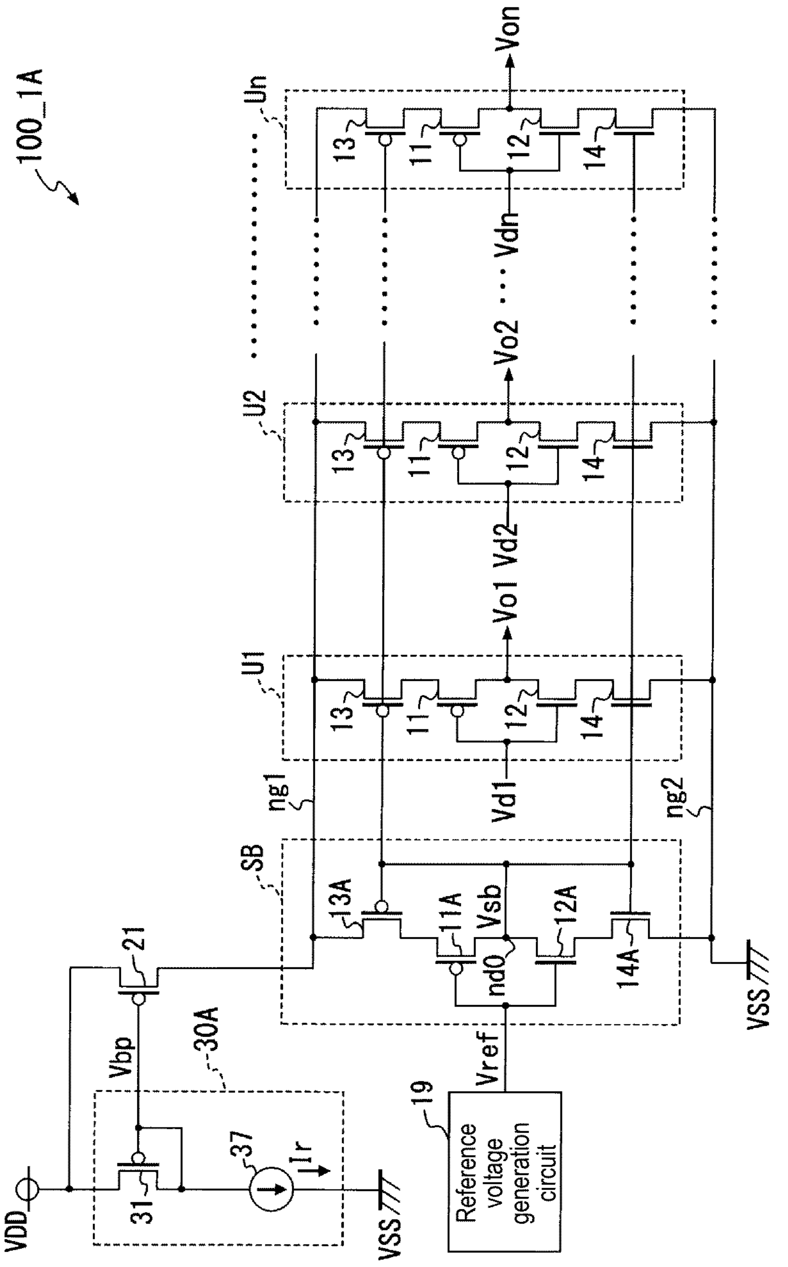
FIG. 4 is a circuit diagram showing the configuration of a voltage detection circuit 100_1A as a modification example of the voltage detection circuit 100_1.

FIG. 4 is a circuit diagram showing the configuration of a voltage detection circuit 100_1A as a modification example of the voltage detection circuit 100_1, made in consideration of such points.

In the voltage detection circuit 100_1A, except for adopting a bias circuit 30A instead of the bias circuit 30, and adopting a P-channel type transistor 21 instead of the transistor 22, the other configurations (19, SB, U1 to Un) are the same as the voltage detection circuit 100_1 shown in FIG. 2.

The bias circuit 30A is the bias circuit 30 shown in FIG. 2 with the transistors 32 and 33 removed. That is, in the bias circuit 30A, at the time when the reference current Ir generated by the current source 37 flows into the drain of the transistor 31, the voltage generated at the gate and the drain of the transistor 31 is supplied to the gate of the transistor 21 as a bias voltage Vbp. In the voltage detection circuit 100_1A, the node ng2 is a power node to which the power voltage VSS is supplied, and the node ng1 has a voltage supplied with the operating current IA through the transistor 21 from the main power voltage VDD. However, if the reference voltage Vref is a voltage close to the main power voltage VDD, the node ng1 becomes a voltage sufficiently close to the main power voltage VDD.

In the transistor 21, the drain is connected via the node ng1 to the source of the transistor 13A included in the self-bias unit SB, and to the source of the transistor 13 included in each of the detection units U1 to Un. The transistor 21 receives, at the source, the main power voltage VDD, generates a drain current based on the bias voltage Vbp supplied to the gate, and causes the drain current to flow as the operating current IA to the source of the transistor 13A of the self-bias unit SB, and to the source of the transistor 13 of each of the detection units U1 to Un.

The voltage detection circuit 100_1A performs the operation shown in FIG. 3 in the same manner as the voltage detection circuit 100_1.

According to the configuration of the voltage detection circuit 100_1A shown in FIG. 4, similar to the voltage detection circuit 100_1, it is possible to reduce the circuit area compared to the case of adopting the comparator shown in FIG. 1 of Patent Document 2.

Furthermore, in the voltage detection circuit 100_1A, the operating current IA flowing to the self-bias unit SB and the detection units U1 to Un is generated by the transistor 21 as the current source. That is, in the voltage detection circuit 100_1A, similar to the voltage detection circuit 100_1, the operating current IA can be limited to any magnitude regardless of the voltage difference between the main power voltage VDD and the power voltage VSS. Therefore, even in the case of adopting a high-voltage main power voltage VDD, or in the case of adopting those having a low threshold voltage Vt as the transistors 13A, 14A, 13, 14 that receive the supply of the self-bias voltage Vsb and included in each of the self-bias unit SB and the detection units U1 to Un, it is possible to reduce power consumption because the static current consumption can be reduced.

In the following examples, the configuration example of the voltage detection circuit will be described where the operating current of the self-bias unit SB and the detection units U1 to Un is limited by the transistor 22 that controls the current based on the power voltage VSS. However, similar to the relationship between the voltage detection circuits 100_1 and 100_1A, it is possible to change to a configuration of a voltage detection circuit where the operating current of the self-bias unit SB and the detection units U1 to Un is limited by the transistor 21 that controls the current based on the main power voltage VDD.

Figure 5A:
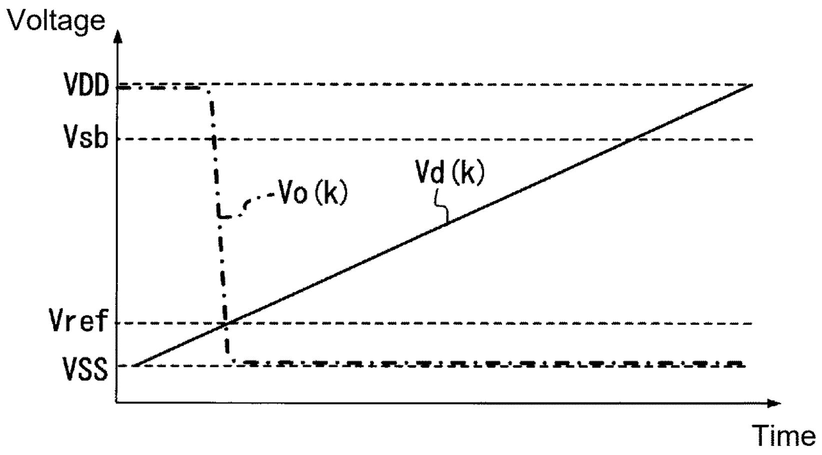
FIG. 5A shows, in a case where a reference voltage Vref has a voltage value near a power voltage VSS, a waveform diagram showing the waveform of a voltage detection signal Vo(k).

In the voltage detection circuit 100_1 or 100_1A, as shown in FIG. 5A, in the case where the reference voltage Vref has a voltage value in the vicinity of the power voltage VSS, the amplitude of the voltage detection signal Vo(k) (where k is an integer from 1 to n) can be made to the amplitude of the power voltage (VDD−VSS).

For example, in the voltage detection circuit 100_1 shown in FIG. 2, in the case where the voltage difference between the reference voltage Vref and the power voltage VSS is relatively small, the gate-source voltage of the transistor 12A is limited, and the drain current thereof, that is, the current flowing to the self-bias unit SB is limited. Since the same current flows through the transistors 11A, 12A, 13A, and 14A, the gate-source voltage of the transistor 13A is also limited. Therefore, the self-bias voltage Vsb becomes a voltage value in the vicinity of the main power voltage VDD. On the other hand, although the gate-source voltage of each of the transistors 11A and 14A increases, the drain-source voltage is limited to a sufficiently small value, thereby allowing a current same as in transistors 12A and 13A to flow. Also, since the transistor 13 in each of the detection units U1 to Un receives at the gate the self-bias voltage Vsb, the current flowing to each of the detection units U1 to Un is limited in the same way as the current flowing to the self-bias unit SB. If the total current value of the current flowing to the self-bias unit SB and each of the detection units U1 to Un is sufficiently smaller than the maximum allowable current value limited by the transistor 22, the drain-source voltage of the transistor 22 is sufficiently small, and the voltage at the node ng2 becomes close to the power voltage VSS. Therefore, the amplitude of the voltage detection signal Vo(k) (where k is an integer from 1 to n) becomes approximately (VDD−VSS).

In the case where the reference voltage Vref is set to the vicinity of the power voltage VSS, the current flowing to the self-bias unit SB and each of the detection units U1 to Un is mostly determined by the voltage difference that exceeds the threshold voltage of the transistor 12A from the voltage difference between the reference voltage Vref and the power voltage VSS, so it is possible to achieve low current consumption even if the transistor 22 that limits the current is omitted. However, considering the variations in the threshold voltage of transistors due to the manufacturing process or temperature changes, for example, in a current detection circuit without the transistor 22, if the operating current is made sufficiently small, the operating current may not be maintained due to an increase in the threshold voltage of the transistor, or the operating current may increase due to a decrease in the threshold voltage of the transistor, resulting in an increase in the current consumption. By controlling the total current (operating current) flowing to the self-bias unit SB and each of the detection units U1 to Un by using the transistor 22, it is possible to secure a margin for the voltage difference between the reference voltage Vref and the power voltage VSS, achieve a stable operation even in the case where variations in the threshold voltage of the transistor occur, and keep the static current consumption sufficiently low.

In addition, in the case where the main power voltage VDD is a relatively high voltage, and the reference voltage Vref is away from the power voltage VSS, without the transistor 22, the current flowing to the self-bias unit SB and each of the detection units U1 to Un may increase significantly, and distortion may occur in the waveform of the voltage detection signal Vo(k) when the voltage Vd(k) changes from a high voltage to a low voltage or from a low voltage to a high voltage with respect to the reference voltage Vref, making it difficult to switch logic values promptly.

Figure 5B:
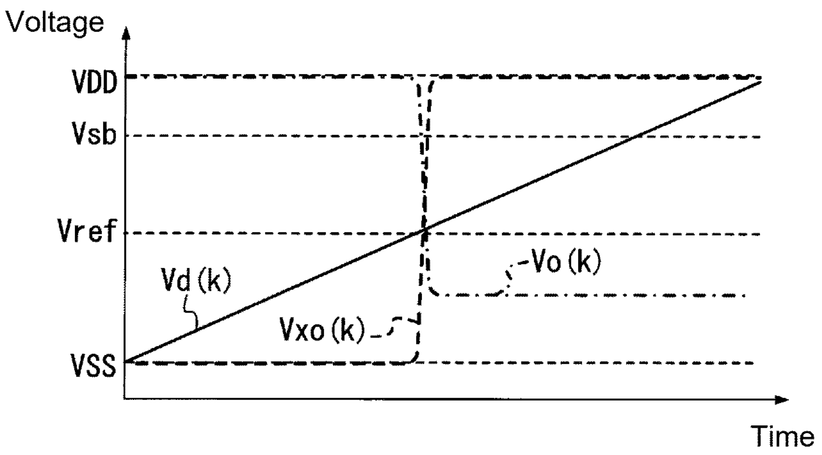
FIG. 5B is a waveform diagram showing the waveform of the voltage detection signal Vo(k) in a case where the main power voltage VDD is high and the reference voltage Vref is away from the power voltage VSS.

On the other hand, in the voltage detection circuit 100_1 of FIG. 2, in the case where the reference voltage Vref is away from the power voltage VSS, since the operating current is controlled by the transistor 22, as an effect of maintaining the current flowing to the self-bias unit SB and each of the detection units U1 to Un, the voltage of the node ng2 rises according to the reference voltage Vref. For example, as shown in FIG. 5B, in the case where the reference voltage Vref has a voltage value closer to the center of the power voltage amplitude (VDD−VSS), the amplitude of the voltage detection signal Vo(k) changes from the main power voltage VDD of the node ng1 to the voltage of the node ng2. At this time, there is almost no waveform distortion during the change of the voltage detection signal Vo(k), and the operating current is also maintained at low current consumption by the transistor 22. However, the low level of the voltage detection signal Vo(k) cannot be lowered to the power voltage VSS. In this case, if the subsequent logic circuit receiving the voltage detection signal Vo(k) is, for example, an inverter circuit, there may be an increase in current consumption because the N-channel type transistor of the inverter circuit is not completely turned OFF even when the voltage detection signal Vo(k) is at low level.

Example 2

Figure 6:
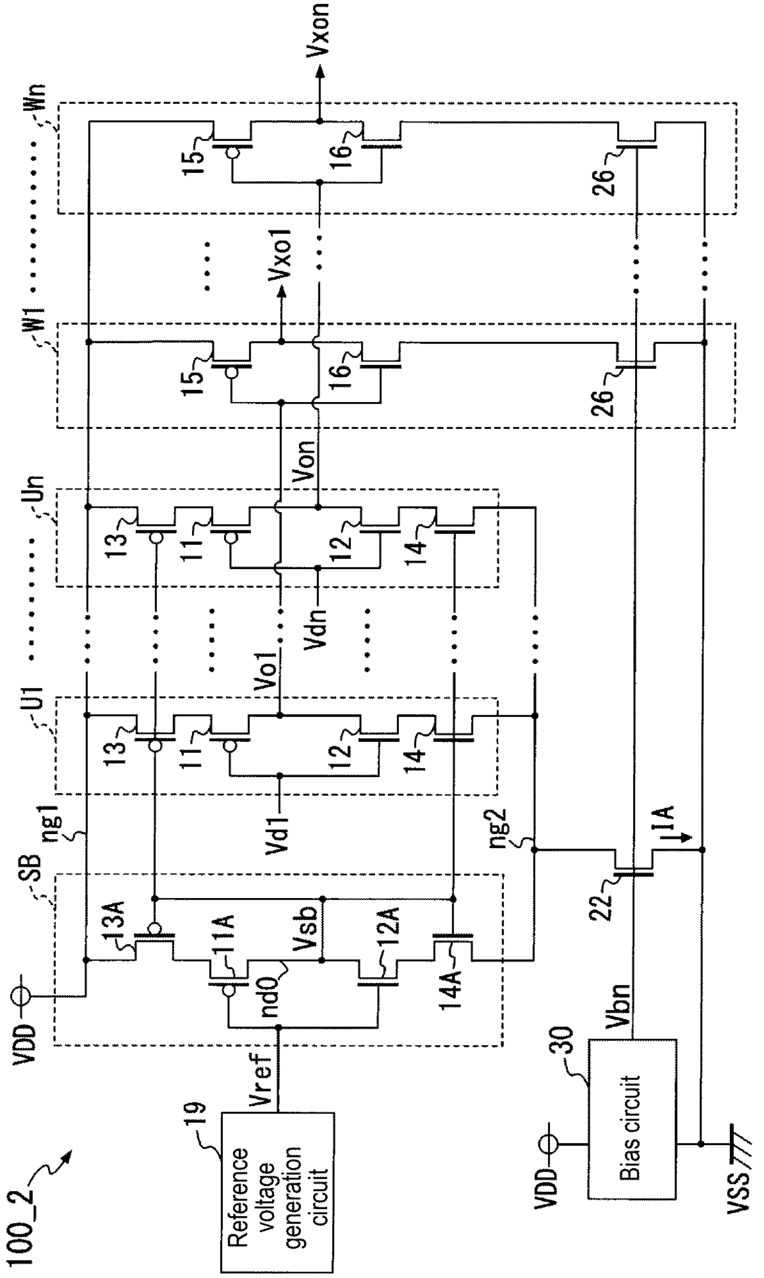
FIG. 6 is a circuit diagram showing the configuration of a voltage detection circuit 100_2 according to the second example.

FIG. 6 is a circuit diagram showing the configuration of a voltage detection circuit 100_2 according to a second example of the invention, which has been made in view of such points.

The voltage detection circuit 100_2 has the same configuration as the voltage detection circuit 100_1 shown in FIG. 2 for other components (19, 22, 30, SB, U1 to Un) except for newly added inverter circuits W1~Wn as waveform shaping units.

Each of the inverter circuits W1 to Wn has the same internal configuration, that is, includes a P-channel type transistor 15 and N-channel type transistors 16, 26. The gates of the transistors 15 and 16 are connected to each other, and the drains of the transistors 11 and 12 are connected to each other. The transistor 15 receives at the source the main power voltage VDD. The transistor 26 receives at the source the power voltage VSS, the drain of the transistor 26 is connected to the source of the transistor 16, and the transistor 26 receives at the gate the bias voltage Vbn.

Here, the inverter circuits W1 to Wn individually receive the voltage detection signals Vo1 to Von at the junction point of the gates of the transistors 15 and 16 included in each circuit as shown in FIG. 6, and output voltage detection signals Vxo1 to Vxon from the junction points of the drains of the transistors 15 and 16 included in each circuit. Also, the transistor 26 controls the operating current of each of the inverter circuits W1~Wn.

With such configuration, in the case where the voltage value of the voltage detection signal Vo(k) received by the inverter circuit W(k) itself is at a high level (VDD), as shown in FIG. 5B, the inverter circuit W(k) outputs a voltage detection signal Vxo(k) with the logic value L having the power voltage VSS. On the other hand, in the case where the voltage value of the voltage detection signal Vo(k) becomes a low level (the voltage of the node ng2), the inverter circuit W(k), as shown in FIG. 5B, outputs a voltage detection signal Vxo(k) with a logic value H having the main power voltage VDD. When the voltage value of the voltage detection signal Vo(k) is at a low level, in the case where the voltage of the node ng2 is higher than the threshold voltage of the transistor 16, the current flows from the main power voltage VDD to the power voltage VSS through the transistors 15 and 16 without turning off the transistor 16, but the current flowing through the transistor 26 is limited.

In other words, in the voltage detection circuit 100_2, by providing the inverter circuits W1 to Wn at a stage following each of the detection units U1 to Un, the waveform of each of the voltage detection signals Vo1 to Von is shaped to swing with the amplitude of the power voltage (VDD−VSS) and is output as the voltage detection signals Vxo1 to Vxon.

Therefore, according to the voltage detection circuit 100_2, even if a high voltage main power voltage VDD or a reference voltage Vref having an arbitrary voltage value is used, it is possible to obtain the voltage detection signals Vxo1 to Vxon that swing with the amplitude of the power voltage (VDD−VSS) while reducing static current consumption.

It should be noted that by providing the inverter circuits W1 to Wn at a stage following each of the detection units U1 to Un in the voltage detection circuit 100_1A, effects similar to those of the voltage detection circuit 100_2 can be realized.

Also, in the voltage detection circuit 100_2, in the case where the reference voltage Vref becomes a voltage away from the power voltage VSS, the node ng2 to which the transistor 22 that controls the current is connected becomes a voltage that follows the reference voltage Vref, and the amplitude of the voltage detection signal Vo(k) becomes smaller than the power voltage difference (VDD−VSS). For example, in the case where the reference voltage Vref is set to the side of the main power voltage VDD, there is a possibility that the amplitude of the voltage detection signal Vo(k) becomes smaller than half of the power voltage difference (VDD−VSS), and in such case, it becomes difficult to shape the waveform into a waveform that swings with the amplitude of the power voltage (VDD−VSS) at the inverter circuit W(k). In view of this point, in the case where the voltage value of the reference voltage Vref is on the side of the power voltage VSS, a configuration in which the operating current of the self-bias unit SB and the detection units U1 to Un is controlled by the transistor 22 connected to the power voltage VSS, as in the voltage detection circuit 100_2, may be adopted. In this case, the amplitude of the voltage detection signal Vo(k) is always be greater than a half of the power voltage difference (VDD−VSS). Similarly, in the case where the voltage value of the reference voltage Vref is on the side of the main power voltage VDD, a configuration in which the operating current of the self-bias unit SB and the detection units U1 to Un is controlled by the transistor 21 connected to the main power voltage VDD, such as a configuration in which an inverter circuit W(k) is added to the voltage detection circuit 100_1A. It should be noted that the transistor 26 of the inverter circuit W(k) only needs to have a function to limit the current, and may be configured by using either an N-channel or P-channel transistor.

In the voltage detection circuits 100_1, 100_1A, and 100_2 described above, the operating current controlled by the transistor 22 or 21 based on the reference current Ir generated by the current source 37 of the bias circuit 30 always flows in the self-bias unit and each detection unit. At this time, the larger the current flowing in the self-bias unit and each detection unit, the higher the response speed of the voltage detection signals Vo1 to Von to the input of the voltage values Vd1 to Vdn that are the detection targets, but the power consumption increases accordingly.

Therefore, it may also be arranged such that when the voltage values Vd1 to Vdn fluctuate and the voltage values exceed a spare detection voltage having a voltage value just before the reference voltage Vref and approach the reference voltage Vref, the current flowing in the self-bias unit and each detection unit is switched from a standby state with a small current to an active state with normal current.

Example 3

Figure 7:
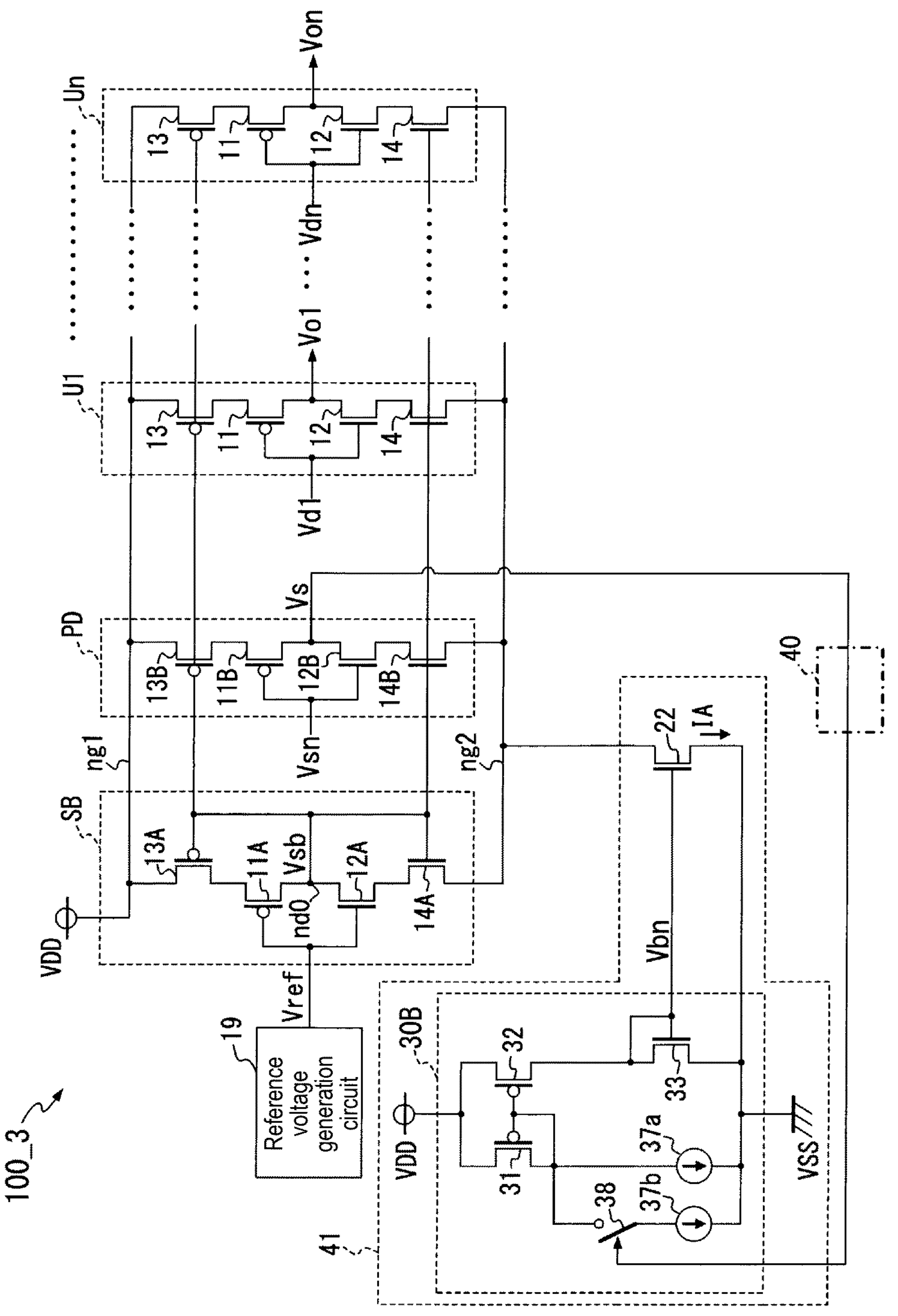
FIG. 7 is a circuit diagram showing the configuration of a voltage detection circuit 100_3 according to the third example.

FIG. 7 is a circuit diagram showing the configuration of a voltage detection circuit 100_3 according to a third example of the invention, which has been made in view of such points.

It should be noted that the voltage detection circuit 100_3 adopts a bias circuit 30B instead of the bias circuit 30 shown in FIG. 2, and includes a current control circuit 41 including the bias circuit 30B and the transistor 22, while other configurations (19, SB, U1 to Un) except for a spare detection unit PD and a circuit 40, which are newly added, are the same as the voltage detection circuit 100_1 shown in FIG. 2.

The spare detection unit PD includes P-channel type transistors 11B and 13B, N-channel type transistors 12B and 14B, and has the same connection configuration as each of the detection units U1 to Un.

In the transistors 11B and 12B, the drains are connected to each other, and the gates are connected to each other. In the transistor 13B, the drain is connected to the source of the transistor 11B, the gate is connected to the node nd0, and the source receives the main power voltage VDD. In the transistor 14B, the drain is connected to the source of the transistor 12, and the gate is connected to the node nd0. The source of the transistor 14B is connected to the node nd2.

Here, in the spare detection unit PD, a spare detection voltage Vsn having a voltage value just before the reference voltage Vref is received at the junction point of the gates of the transistors 11B and 12B, and a spare voltage detection signal Vs as follows is output from the junction point of the drains of the transistors 11B and 12B.

That is, the spare detection unit PD, with the configuration (11B to 14B), generates a binary spare voltage detection signal Vs representing the logic value H in the case where the spare detection voltage Vsn is equal to or lower than the reference voltage Vref, and the logic value L when the spare detection voltage Vsn is higher than the reference voltage Vref, and supplies the binary spare voltage detection signal Vs to the bias circuit 30B. In the case where the reference voltage Vref becomes a voltage away from the power voltage VSS, the circuit 40 similar to the inverter circuit W(k) in FIG. 6 may be provided between the spare detection unit PD and the current control circuit 41 as shown in FIG.

7. The circuit 40 has a function of waveform-shaping the spare detection signal Vs into the amplitude of the power voltage difference (VDD–VSS) and supplying the spare detection signal Vs to the bias circuit 30B of the current control circuit 41 in the case where the amplitude of the spare detection signal Vs output from the spare detection unit PD is smaller than the power voltage difference (VDD–VSS). Also, in the case where the reference voltage Vref is set in the vicinity of the power voltage VSS, the amplitude of the spare detection signal Vs becomes the power voltage difference (VDD–VSS), so there is no need to provide the circuit 40.

The bias circuit 30B includes a circuit formed by transistors 31 to 33, similar to the bias circuit 30. Furthermore, the bias circuit 30B includes a first current source 37*a* that causes a reference current smaller than the current source 37 included in the bias circuit 30 to flow to the drain of the transistor 31, a newly added second current source 37*b*, and a switch 38.

The switch 38 receives the spare voltage detection signal Vs and is set to the ON state or the OFF state according to the logic value of the spare voltage detection signal Vs. At this time, in the case where the switch 38 is in the ON state, a constant current generated by the current source 37*b* is caused to flow to the drain of the transistor 31. Therefore, at this time, a composite current, which is a combination of the reference current generated by the current source 37*a* and the constant current generated by the current source 37*b*, flows through transistor 31. The magnitude of the constant current generated by the current source 37*b* is set, so that the composite current is equal to or greater than the reference current Ir generated by the current source 37 included in the bias circuit 30.

In other words, while the switch 38 is in the OFF state, based on the bias voltage Vbn corresponding to a reference current lower than the reference current Ir by the current source 37*a*, the transistor 22 generates an operating current IA lower than the rated current. Such state becomes a standby state.

Meanwhile, while the switch 38 is in the ON state, the constant current generated by the current source 37*b* is combined with the reference current generated by the current source 37*a*. As a result, based on the bias voltage Vbn corresponding to the rated current equal to the reference current Ir, the transistor 22 generates a normal operating current IA having the rated current. Such state becomes an active state.

The following describes the variable control of the operating current of the self-bias unit and each detection unit in the voltage detection circuit 100_3.

Figure 8A:
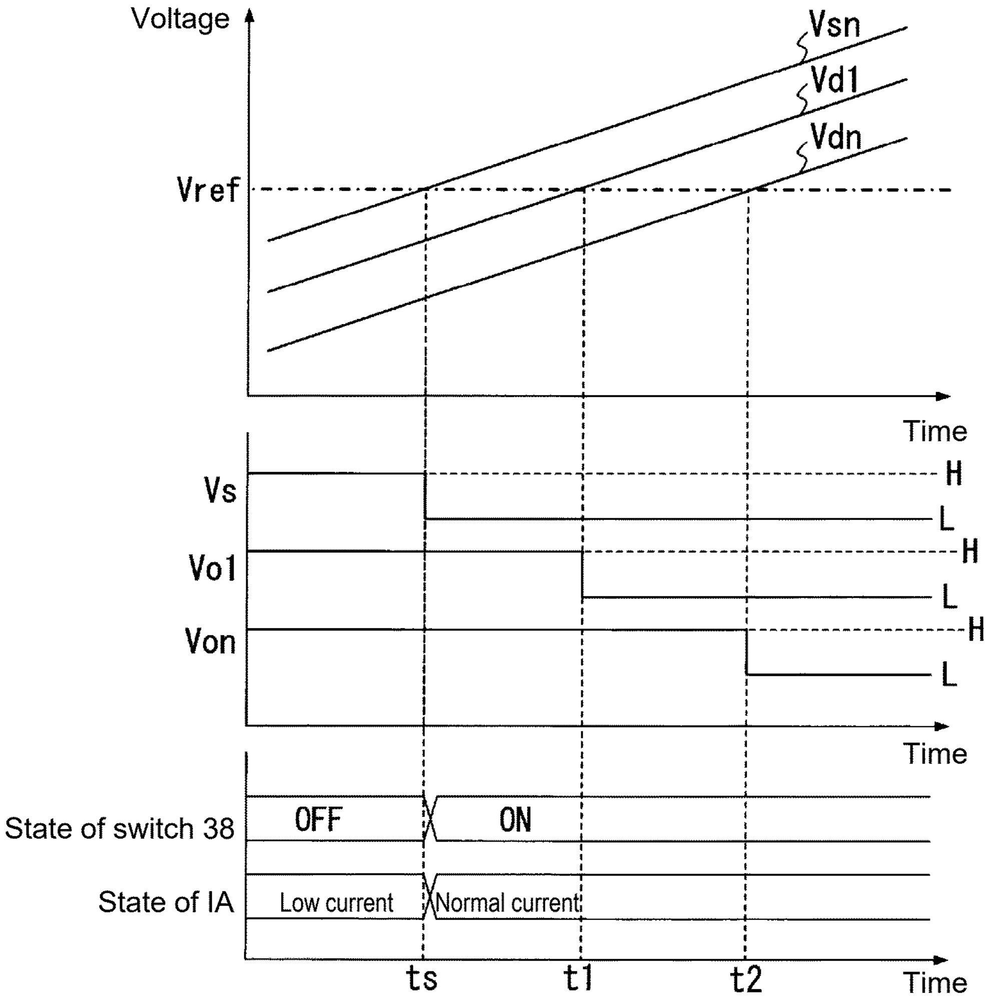
FIG. 8A is a waveform diagram showing the internal waveform of the voltage detection circuit 100_3 in a case of detecting (high voltage detection) a state where voltages Vd1 and Vdn (Vd1>Vdn) become higher than the reference voltage Vref together with voltage fluctuation(rise).

FIG. 8A is a waveform diagram showing the internal waveforms of the voltage detection circuit 100_3 in the case of detecting (high voltage detection) a state where the voltages Vd1 and Vdn (Vd1>Vdn) as detection target voltages become higher than the reference voltage Vref together with voltage fluctuation(rise).

In an example shown in FIG. 8A, in order to detect the time point immediately before the voltage value of the voltage Vd1 reaches the reference voltage Vref, a spare detection voltage Vsn which is higher than voltage Vd1 and of which a voltage value increases at the same voltage change rate as the voltage Vd1 is supplied to the spare detection unit PD.

As shown in FIG. 8A, while the spare detection voltage Vsn, the voltage Vd1 and the voltage Vdn are equal to or lower than the reference voltage Vref, the spare detection unit PD outputs the spare voltage detection signal Vs of the logic value H, and the detection units U1 and Un output the voltage detection signals Vo1 and Von of the logic value H, respectively. Furthermore, during this period, in accordance with the spare voltage detection signal Vs of the logic value H, the switch 38 is in the OFF state, and the operating current IA transmitted from the transistor 22 is in the standby state with a low current lower than the rated current.

Here, as shown in FIG. 8A, as the voltage values of the spare detection voltage Vsn, the voltage Vd1 and the voltage Vdn each gradually increase, at a time point ts, when the voltage value of the spare detection voltage Vsn becomes higher than the reference voltage Vref, the spare detection unit PD changes the spare voltage detection signal Vs from the state of the logic value H to the logic value L. Therefore, in response to the spare voltage detection signal Vs of the logic value L, the switch 38 enters the ON state, and the operating current IA transmitted from the transistor 22 enters the active state with a normal current having the rated current.

Then, as the voltage values of the spare detection voltage Vsn, the voltage Vd1 and the voltage Vdn each rise, at a time point t1 shown in FIG. 8A, when the voltage value of the voltage Vd1 becomes higher than the reference voltage Vref, the detection unit U1 changes the voltage detection signal Vo1 from the state of the logic value H to the logic value L.

Moreover, as the voltage values of the spare detection voltage Vsn, the voltage Vd1 and the voltage Vdn each rise, at the time point t2 shown in FIG. 8A, when the voltage value of the voltage Vdn becomes higher than the reference voltage Vref, the detection unit Un changes the voltage detection signal Von from the state of the logic value H to the logic value L.

Figure 8B:
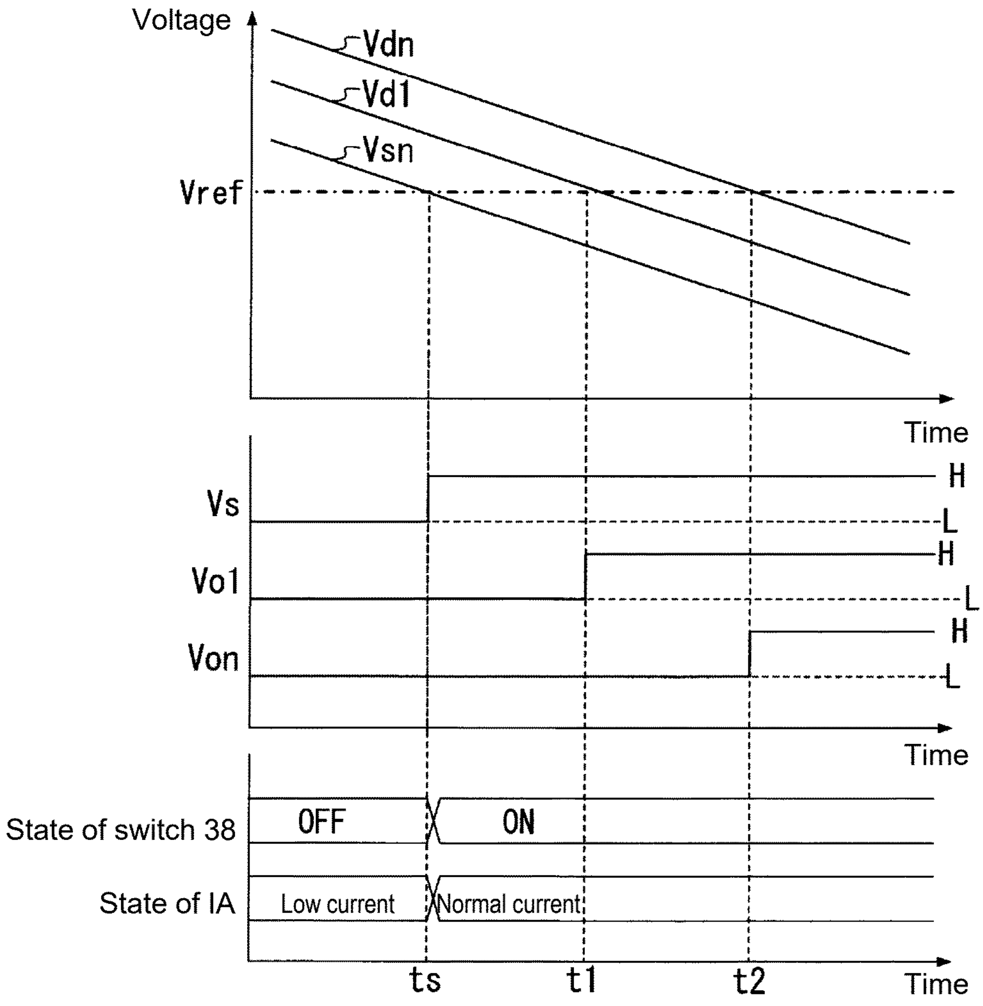
FIG. 8B is a waveform diagram showing the internal waveform of the voltage detection circuit 100_3 in a case of detecting (low voltage detection) a state where the voltages Vd1 and Vdn (Vd1<Vdn) become lower than the reference voltage Vref together with voltage fluctuation (decrease).

FIG. 8B is a waveform diagram showing the internal waveform of a voltage detection circuit 100_5 in a case of detecting (low voltage detection) a state where the voltages Vd1 and Vdn (Vd1<Vdn) become lower than the reference voltage Vref together with voltage fluctuation (decrease).

In an example shown in FIG. 8B, in order to detect the time point immediately before the voltage value of the voltage Vd1 reaches the reference voltage Vref, a spare detection voltage Vsn which is lower than the voltage Vd1 and of which a voltage value decreases at the same voltage change rate as the voltage Vd1 is supplied to the spare detection unit PD.

As shown in FIG. 8B, while the spare detection voltage Vsn, the voltage Vd1 and the voltage Vdn are higher than the reference voltage Vref, the spare detection unit PD outputs the spare voltage detection signal Vs of the logic value L, and the detection units U1 and Un output the voltage detection signals Vo1 and Von of the logic value L, respectively. Furthermore, during this period, in accordance with the spare voltage detection signal Vs of the logic value L, the switch 38 is in the OFF state, and the operating current IA transmitted from the transistor 22 is in the standby state with a low current lower than the rated current.

Here, as shown in FIG. 8B, as the voltage values of the spare detection voltage Vsn, the voltage Vd1 and the voltage Vdn each gradually increase, at a time point ts, when the voltage value of the spare detection voltage Vsn becomes lower than the reference voltage Vref, the spare detection unit PD changes the spare voltage detection signal Vs from the state of the logic value L to the logic value H. Therefore, in response to the spare voltage detection signal Vs of the logic value H, the switch 38 enters the ON state, and the operating current IA transmitted from the transistor 22 enters the active state with a normal current having the rated current.

Then, as the voltage values of the spare detection voltage Vsn, the voltage Vd1 and the voltage Vdn each decrease, at the time point t1 shown in FIG. 8B, when the voltage value of the voltage Vd1 becomes lower than the reference voltage Vref, the detection unit U1 changes the voltage detection signal Vo1 from the state of the logic value L to the logic value H.

Figures 10A, 10B:
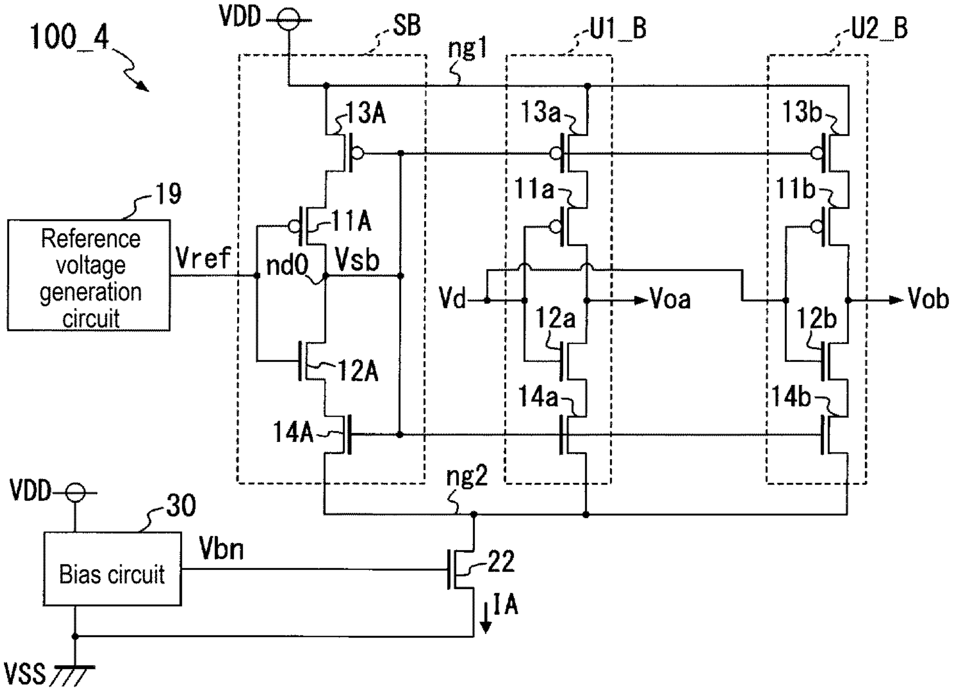
FIG. 10A is a circuit diagram showing the configuration of a voltage detection circuit 100_4 according to the fourth example.
FIG. 10B is a diagram showing voltage detection signals (Voa, Vob) where logic inversion occurs relative to changes in the voltage Vd, and threshold voltages, for each W/L size ratio of transistors 13A, 13*a*, and 13*b*.

Moreover, as the voltage values of the spare detection voltage Vsn, the voltage Vd1 and the voltage Vdn each decrease, at the time point t2 shown in FIG. 10B, when the voltage value of the voltage Vdn becomes lower than the reference voltage Vref, the detection unit Un changes the voltage detection signal Von from the state of the logic value L to the logic value H.

In this way, in the voltage detection circuit 100_3, the spare detection voltage Vsn having a voltage value higher or lower than any of the voltages Vd1 to Vdn that are detection targets is received. As a result, as shown in FIG. 8A or FIG. 8B, before the voltages Vd1 and Vdn reach the reference voltage Vref, the spare detection voltage Vsn reaches the reference voltage Vref in advance. Here, when the voltage value of the spare detection voltage Vsn exceeds the reference voltage Vref, the spare detection unit PD inverts the logic value of the spare voltage detection signal Vs. As a result, the switch 38 of the bias circuit 30B turns on, and the bias voltage Vbn supplied to the gate of the transistor 22 increases. Therefore, the transistor 22 receiving the bias voltage Vbn increases the operating current IA.

In other words, in the voltage detection circuit 100_3, the voltages Vd1 and Vdn as the detection target voltages approach the reference voltage Vref due to voltage fluctuation, the responsiveness of the detection operation is improved by increasing the operating current IA from the standby state with a low current to the active state with a normal rated current.

Meanwhile, in the case where the voltages Vd1 and Vdn are away from the reference voltage Vref, that is, in the case where the difference between the two is large, the voltage detection circuit 100_3 reduces the static current consumption by setting the standby state where the operating current IA is forced to be lowered.

While the voltage detection circuit 100_3 in FIG. 7 is a configuration example that switches the operating current IA flowing through the transistor 22 by receiving the spare voltage detection signal Vs and switching the bias voltage Vbn, it is also possible to provide another transistor connected in parallel with the transistor 22, and variably control the operating current of the self-bias unit and each detection unit by controlling the activation and deactivation of such transistor.

Figure 9:
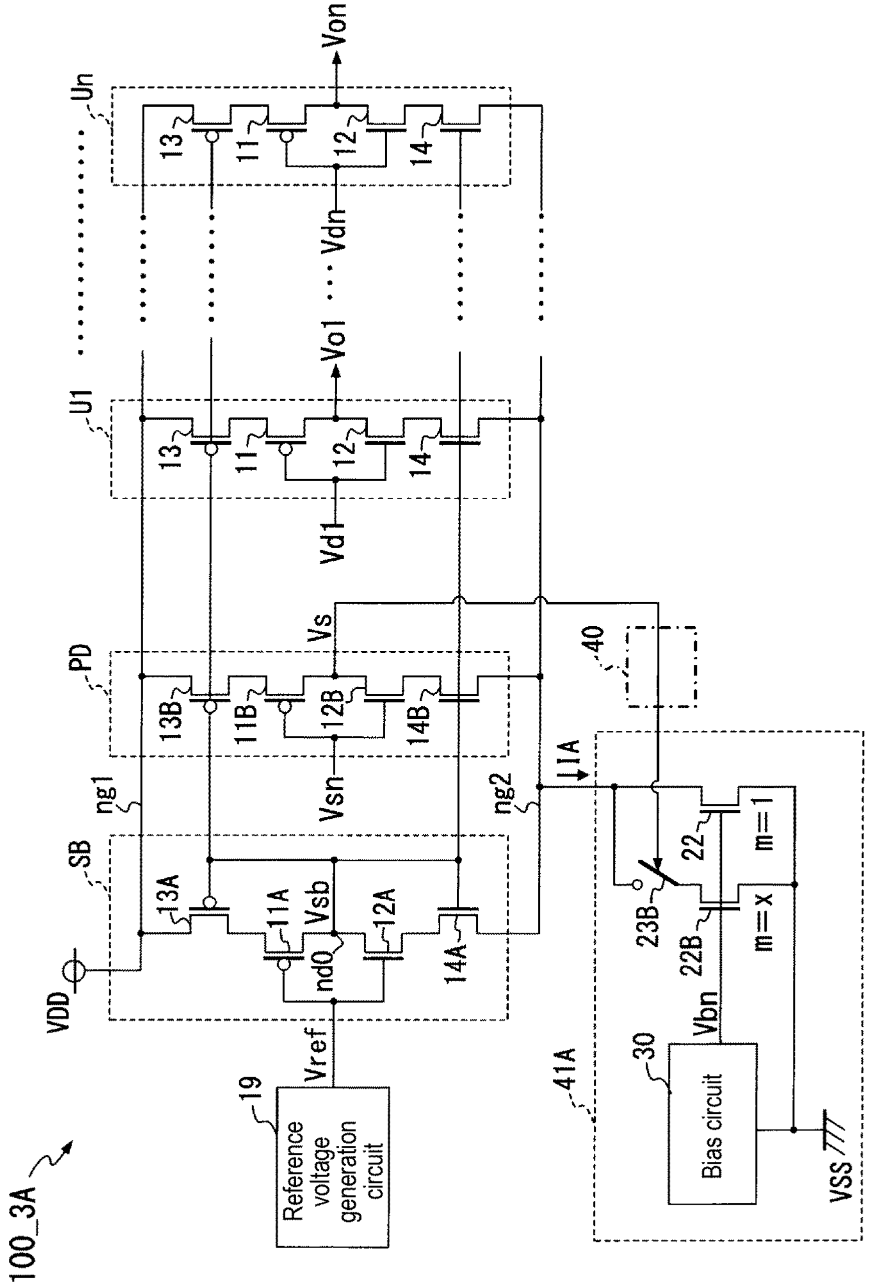
FIG. 9 is a circuit diagram showing the configuration of a voltage detection circuit 100_3A as a modification example of the voltage detection circuit 100_3.

FIG. 9 is a circuit diagram showing the configuration of a voltage detection circuit 100_3A as a modification example of the voltage detection circuit 100_3, made in consideration of such points.

In the voltage detection circuit 100_3A, except for adopting the current control circuit 41A instead of the current control circuit 41, other configurations (19, SB, PD, U1 to Un, 40) are the same as the voltage detection circuit 100_3 shown in FIG. 7.

The current control circuit 41A includes, in addition to the bias circuit 30 and the transistor 22 similar to the voltage detection circuit 100_1, a transistor 22B and a switch 23B. In the transistor 22B, the drain is connected to the node ng2 via the switch 23B, the source receives the power voltage VSS, and the gate is supplied with the bias voltage Vbn from the bias circuit 30.

The switch 23B receives the spare voltage detection signal Vs and is set to the ON state or the OFF state according to the logic value of the spare voltage detection signal Vs. At this time, when the switch 23B is in the OFF state, the transistor 22B is deactivated, and the operating current IA of the self-bias unit and each detection unit becomes the current flowing through the transistor 22. Meanwhile, in the case where the switch 23B is in the ON state, the transistor 22B is activated, and the operating current IA of the self-bias unit and each detection unit becomes the total current of the current flowing through the transistor 22 and the current flowing through the transistor 22B.

In other words, while the switch 23B is in the OFF state, the operating current IA lower than the rated current is generated by the transistor 22, and while the switch 23B is in the ON state, the normal operating current IA having the rated current is generated by the transistors 22 and 22B. It should be noted that the transistor 22B may be configured with any m number of transistors in parallel.

Additionally, the variable control of the operating current of the self-bias unit and each detection unit in the voltage detection circuit 100_3A can be controlled as shown in FIG. 8A and FIG. 8B, similar to the voltage detection circuit 100_3.

Example 4

FIG. 10A is a circuit diagram showing the configuration of a voltage detection circuit 100_4 according to the fourth example of the invention.

For each of the first and second threshold voltages whose voltage values are different from each other, the voltage detection circuit 100_4 performs voltage detection to detect whether the voltage Vd of one system as the detection target voltage is higher than the threshold voltage, and outputs voltage detection signals Voa and Vob that individually represent each detection result.

The voltage detection circuit 100_4 is similar to the voltage detection circuit 100_1 shown in FIG. 2, except that the voltage detection circuit 100_4 adopts detection units U1_B and U2_B of two systems in place of the detection units U1 to Un shown in FIG. 2, with other configurations (19, 22, 30, SB) being the same.

The detection unit U1_B includes a P-channel type transistor 11*a*, an N-channel type transistor 12*a*, a P-channel type transistor 13*a*, and an N-channel type transistor 14*a*.

The gates of the transistors 11*a* and 12*a* are connected to each other, and the drains of the transistors 11*a* and 12*a* are connected to each other. In the transistor 13*a*, the drain is connected to the source of the transistor 11*a*, the gate is connected to the node nd0, and the source receives the main power voltage VDD. In the transistor 14*a*, the drain is connected to the source of the transistor 12, the gate is connected to the node nd0, and the source is connected to the node ng2. The detection unit U2_B also has a similar configuration to the detection unit U1_B, including a P-channel type transistor 11*b*, an N-channel type transistor 12*b*, a P-channel type transistor 13*b*, and an N-channel type transistor 14*b*.

The detection units U1_B and U2_B receive a common voltage Vd, which is the voltage detection target, at the junction point of the gates of the transistors 11*a* and 12*a* and the junction point of the gates of the transistors 11*b* and 12*b*, respectively, and output the voltage detection signals Voa and Vob from the junction point of the drains of the transistors 11$a$ and 12$a$ and the junction point of the drains of the transistors 11$b$ and 12$b$, respectively.

In the transistor 22 serving as a current source, the drain connected to the source of the transistor 14A included in the self-bias unit SB, the source of the transistor 14$a$ included in the detection unit U1_B, and the source of the transistor 14$b$ included in the detection unit U2_B. The transistor 22 receives at the gate the bias voltage Vbn generated by the bias circuit 30, and supplies the operating current IA of a magnitude corresponding to the bias voltage Vbn to the self-bias unit SB and the detection units U1_B and U2_B.

In the voltage detection circuit 100_4, the ratio of a channel width W to a channel length L (hereinafter referred to as W/L size ratio) of the transistor 13$a$ included in the detection unit U1_B is made smaller than the W/L size ratio of the transistor 13A included in the self-bias unit SB. Alternatively, the W/L size ratio of the transistor 13$b$ included in the detection unit U2_B is made larger than the W/L size ratio of the transistor 13A included in the self-bias unit SB. The targets for variably setting the W/L size ratio here are transistors of the same conduction type that jointly receive the self-bias voltage Vsb.

As a result, for the common self-bias voltage Vsb, the current values controlled by the transistors 13A, 13$a$, and 13$b$ in the self-bias unit SB and detection units U1_B and U2_B, respectively, are such that the control current of the transistor 13$a$ is smaller than the control current of the transistor 13A, and the control current of the transistor 13$b$ is larger than the control current of the transistor 13A. On the other hand, the control currents of the transistors 14A, 14$a$, and 14$b$ are equal. With the action of offsetting the control current values between the current inflow side (13A, 13$a$, 13$b$) and the outflow side (14A, 14$a$, 14$b$), the threshold voltage at which the logic values of the voltage detection signals Voa and Vob switch with respect to the voltage Vd can be offset from the reference voltage Vref.

Here, it is unnecessary to change the W/L size ratio for other transistors (11$a$, 12$a$, 14$a$, 11$b$, 12$b$, 14$b$) included in the detection units U1_B and U2_B. As mentioned above, as transistors for changing the threshold voltage at which the logic value of the voltage detection signal switches by changing the W/L size ratios of the transistors, transistors receiving, at the gates, the self-bias voltage Vsb are preferable.

FIG. 10B is a diagram showing the voltage detection signals (Voa, Vob) that output logic values according to changes in the voltage Vd, and the threshold voltages at which the logic values of the voltage detection signals (Voa, Vob) are inverted, for each of the W/L size ratios of the three systems of the transistor 13A in the self-bias unit SB, the transistor 13$a$ in the detection unit U1_B, and the transistor 13$b$ in the detection unit U2_B shown in FIG. 10A.

That is, at the first W/L size ratio shown in FIG. 10B, the transistors 13A, 13$a$, and 13$b$ all have a predetermined normal size. At this time, the voltage detection signals Voa and Vob both undergo logic inversion at the time when the voltage Vd matches the reference voltage Vref.

Also, in the second W/L size ratio shown in FIG. 10B, only the W/L size ratio of the transistor 13$a$ becomes smaller than those of other transistors. At this time, the voltage detection signal Voa undergoes logic inversion at the time when the voltage Vd matches a first reference voltage Vrefa (Vrefa<Vref) lower than the reference voltage Vref.

Also, in the third W/L size ratio shown in FIG. 10B, only the W/L size ratio of the transistor 13$b$ becomes larger than those of other transistors. At this time, the voltage detection signal Vob undergoes logic inversion at the time when the voltage Vd matches a second reference voltage Vrefb (Vrefb>Vref) higher than the reference voltage Vref.

In this way, in the voltage detection circuit 100_4, by making the W/L size ratios of the transistors (13$a$, 13$b$) in the respective detection units different from the transistor (13A) in the self-bias unit SB, it is possible to detect the magnitude of the voltage Vd of one system as the detection target in stages by using multiple threshold voltages (Vrefa, Vrefb).

Figure 10C:
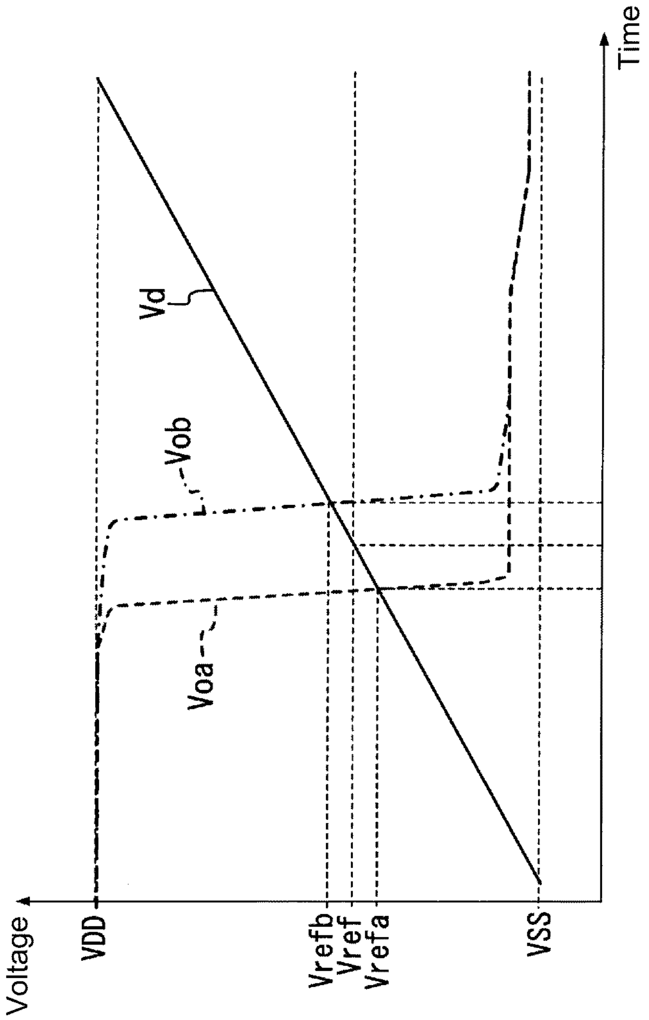
FIG. 10C is a waveform diagram showing simulation results of the reference voltage Vref, thresholds (Vrefa, Vrefb), and voltage detection signals Voa and Vob relative to changes of the voltage Vd in a configuration where each W/L size ratio is set.

FIG. 10C is a waveform diagram showing simulation results of the reference voltage Vref, the threshold voltages (Vrefa, Vrefb), and the voltage detection signals Voa and Vob with respect to the changes in the voltage Vd as the detection target, in a configuration where the respective W/L size ratios as shown in FIG. 10B are set.

Here, when the W/L size ratio of the transistor 13$a$, which receives at the gate the self-bias voltage Vsb, is made smaller than other transistors, the threshold voltage can be shifted to the first reference voltage Vrefa lower than the reference voltage Vref. Meanwhile, when the W/L size ratio of the transistor 13$b$, which receives at the gate the self-bias voltage Vsb, is made larger than other transistors, the threshold voltage can be shifted to the second reference voltage Vrefb, which is higher than the reference voltage Vref.

Accordingly, it is possible to determine whether the voltage Vd is within a voltage range in the vicinity of the reference voltage Vref (Vrefa<Vref<Vrefb) based on the logic values of the voltage detection signals Voa and Vob with respect to changes of the voltage Vd of one system, for example. Such determination can prevent frequent switching of logic values due to noise when the voltage Vd contains noise. Also, it is possible to make a determination with hysteresis by making a determination using the voltage detection signal Vob when the voltage Vd is rising, and making a determination using the voltage detection signal Voa when the voltage Vd is falling. In FIG. 10C, although the description is made using the voltages Vrefa and Vrefb that are away from the reference voltage Vref, it is of course possible to configure one of the voltages Vrefa or Vrefb to be the reference voltage Vref.

Example 5

Figure 11:
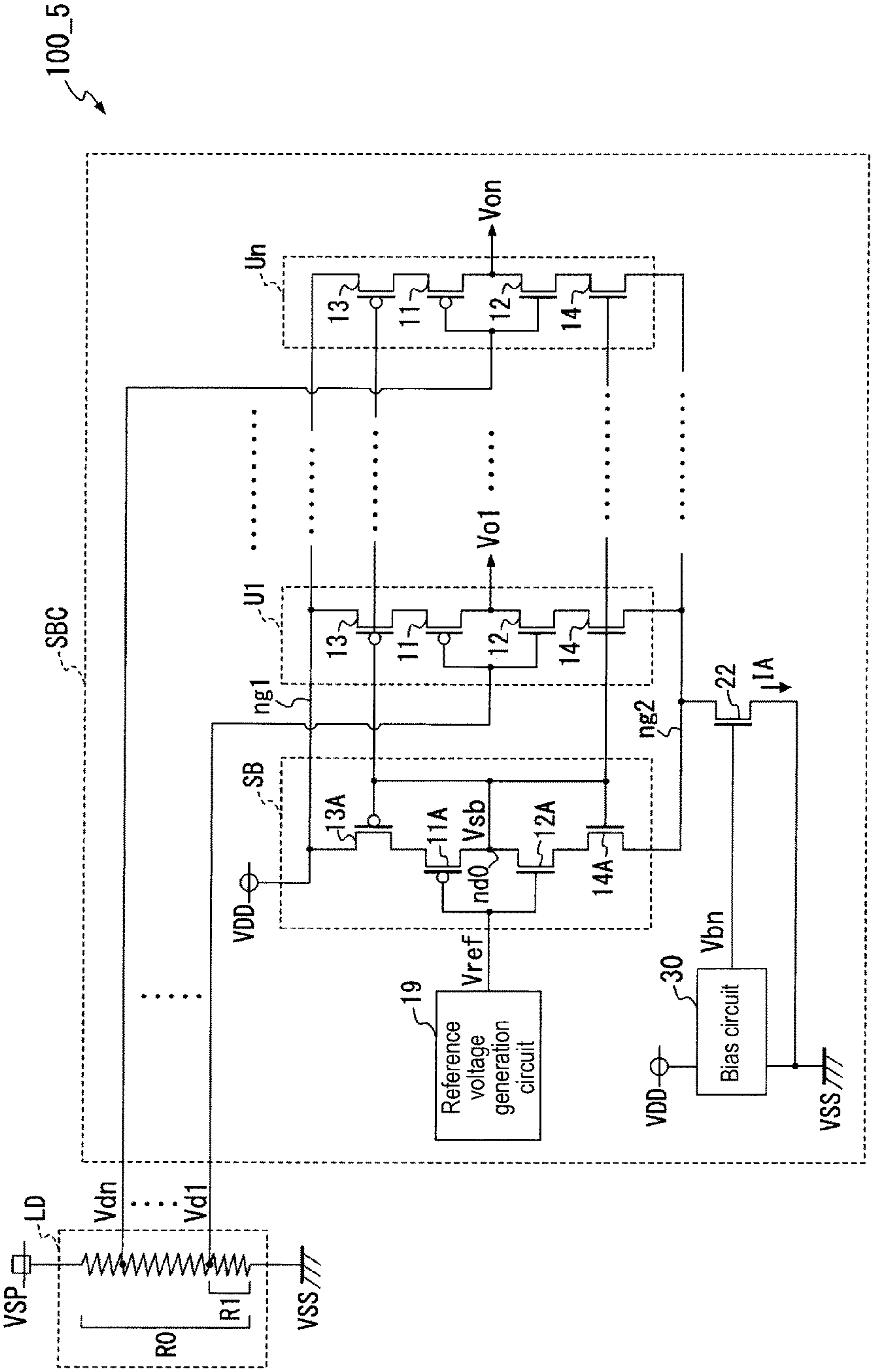
FIG. 11 is a circuit diagram showing the configuration of a voltage detection circuit 100_5 according to the fifth example.

FIG. 11 is a circuit diagram showing the configuration of a voltage detection circuit 100_5 according to the fifth example according to the invention.

The voltage detection circuit 100_5 detects an abnormal voltage drop or voltage rise in the power voltage VSP, which is the detection target voltage, in n stages (where n is an integer of 2 or more), and outputs signals indicating the detection results for respective stages as the voltage detection signals Vo1 to Von.

The voltage detection circuit 100_5 directly includes the voltage detection circuit 100_1 shown in FIG. 2 as a voltage detection unit SBC. Additionally, the voltage detection circuit 100_5 includes a resistor string LD that generates voltages Vd1 to Vdn respectively corresponding to the n threshold voltages that define the n stages, and individually supplies the voltages Vd1 to Vdn individually to the detection units U1 to Un respectively.

The resistor string LD receives at one end the power voltage VSP as is the detection target, and receives at the other end the power voltage VSS (for example, 0 volts).

Here, if the total resistance value of the resistor string LD is expressed as a resistance value R0, and the resistance value from the tap where the voltage Vd1 is extracted to the power voltage VSS in the resistor string LD is expressed as a resistance value R1, then the voltage Vd1 is as follows:

$$Vd1 = VSP(R1/R0) \quad (1)$$

Here, if the voltage value of the power voltage VSP that is determined to have dropped is expressed as VSPe, and the threshold voltage at which the voltage value of the power voltage VSP is determined to have dropped to VSPe based on the voltage value of Vd1 is expressed as Vde1, Vde1 is as follows:

$$Vde1 = VSPe(R1/R0) = Vref$$

and, in this way, VSPe is expressed as follows:

$$VSPe = Vref * (R0/R1). \quad (2)$$

For example, in the case of setting the power voltage VSP to 10 volts, the reference voltage Vref to 1V, VSPe to 5V, and configuring to detect an abnormally low voltage when the power voltage VSP drops to 5V as indicated by VSPe, according to (2), $$5 = (R1/R0), \quad (3)$$

and, according to (1) and (3), $$Vd1 = 10V/5 = 2V$$

Therefore, when the voltage value of the power voltage VSP=10 V falls to or below VSPe=5 V, which is determined to be an abnormally low voltage, the voltage Vd1 set by the resistance value R1 falls from the initial value of 2 V, and when the voltage Vd1 falls below the reference voltage Vref (threshold voltage Vde1)=1 V, the logical value of the voltage detection signal Vo1 is inverted, and an abnormally low voltage is detected. Similarly, by setting voltages Vd2 to Vdn by resistance values R2 to Rn, an abnormal low voltage of the power voltage VSP can be detected in n stages using the voltage detection signals Vo1 to Von.

In addition, by providing the resistor string LD to the voltage detection circuits 100_1A, 100_2, 100_3, 100_3A, or 100_4, it is possible to implement a function similar to that of the power voltage detection circuit 100_5 shown in FIG. 11.

Example 6

Figure 12:
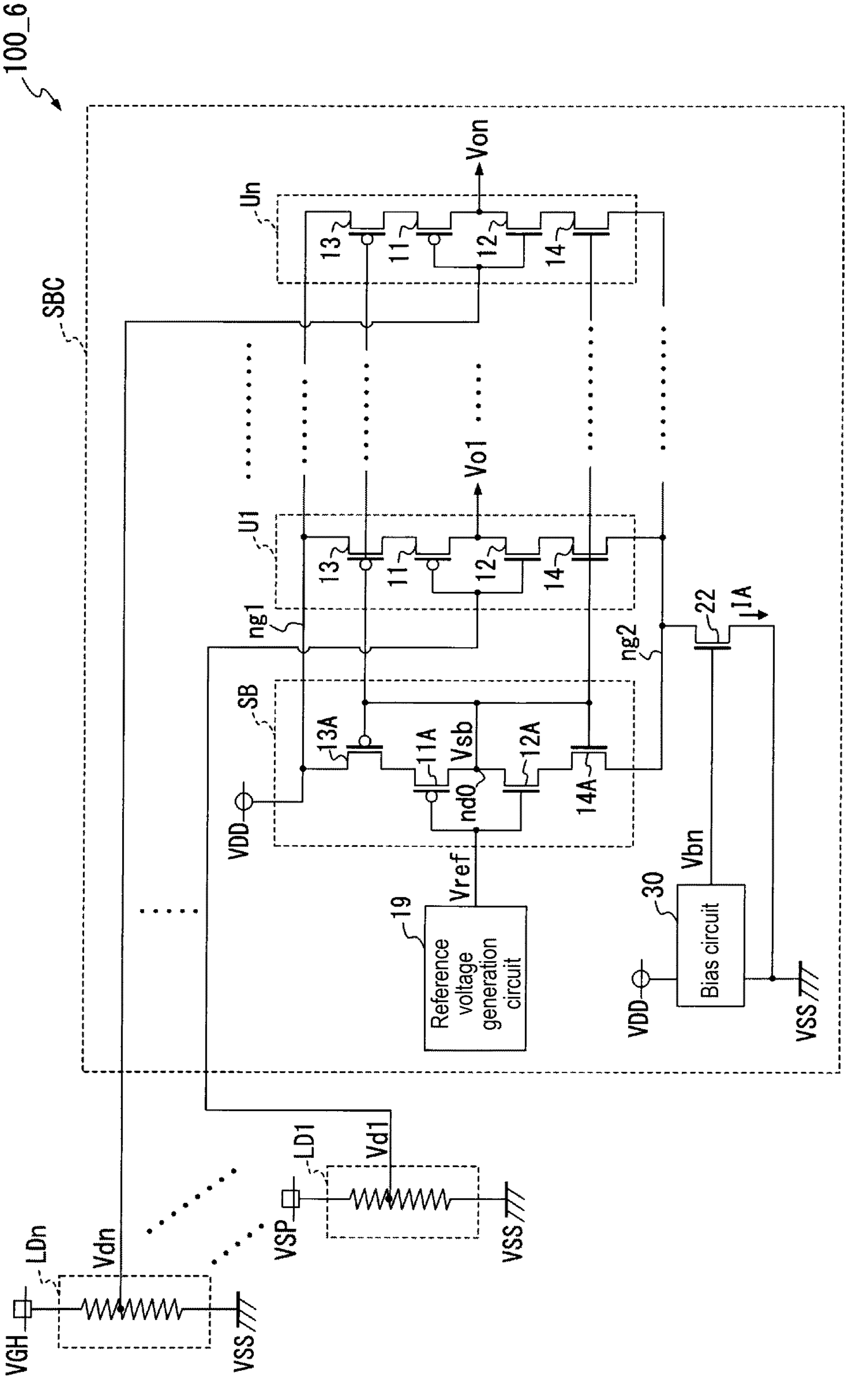
FIG. 12 is a circuit diagram showing the configuration of a voltage detection circuit 100_6 according to the sixth example.

FIG. 12 is a circuit diagram showing the configuration of a voltage detection circuit 100_6 according to the sixth example according to the invention.

The voltage detection circuit 100_6 simultaneously detects abnormal voltage drops or abnormal voltage rises in the power voltages of n (where n is an integer of 2 or more) systems as the voltages serving as the detection targets, and outputs signals indicating the detection results corresponding to the respective power voltages of the n systems as the voltage detection signals Vo1 to Von.

The voltage detection circuit 100_6 directly includes the voltage detection circuit 100_1 shown in FIG. 2 as the voltage detection unit SBC.

Furthermore, the voltage detection circuit 100_6 includes first to $n^{th}$ resistance strings LD1 to LDn individually receiving the power voltages of the n systems, and supply voltages obtained by individually dividing the respectively received power voltages, as the voltages Vd1 to Vdn, to the detection units U1 to Un. For example, in the example shown in FIG. 12, the resistor string LD1 receives the power voltage VSP and supplies, as the voltage Vd1, a voltage obtained by dividing the power voltage VSP to the detection unit U1 as the voltage Vd1. Also, the resistor string LDn receives the power voltage VGH and supplies the voltage obtained by dividing the power voltage VGH to the detection unit Un as the voltage Vdn.

In addition, by providing the resistor strings LD to LDn to the voltage detection circuit 100_1A, 100_2, 100_3, 100_3A, or 100_4, it is possible to implement a function similar to that of the power voltage detection circuit 100_6 shown in FIG. 12.

As described in detail above, the voltage detection circuits 100_1 to 100_6 (excluding 100_4), in comparing the magnitudes of the reference voltage Vref with each of the first to $n^{th}$ (where n is an integer of 2 or more) voltages Vd1 to Vdn as the detection targets and generating the first to $n^{th}$ voltage detection signals Vo1 to Von indicating whether each voltage is higher than the reference voltage, the configuration as follows is adopted.

That is, the voltage detection circuit according to the invention includes the self-bias unit (SB, SB_A) that generates the self-bias voltage (Vsb) based on the reference voltage (Vref), and the first to $n^{th}$ detection units (U1 to Un, U1_A to Un_A) that individually receive the first to $n^{th}$ voltages (Vd1 to Vdn) and individually output the first to $n^{th}$ voltage detection signals (Vo1 to Von).

The self-bias unit includes the first to fourth transistors as follows.

The first and second transistors (11A, 12A) are of mutually different conductive types. In the first and second transistors, the respective drains are connected via the first node (nd0). The first and second transistors generate the voltage occurring at the first node as the self-bias voltage (Vsb) by receiving, at the respective gates, the reference voltage (Vref). The third transistor (13A) receives, at the gate, the self-bias voltage (Vsb), supplies a current corresponding to the difference between the voltage at the source of the third transistor and the self-bias voltage to the source of the first transistor (11A). The fourth transistor (14A) receives, at the gate, the self-bias voltage (Vsb), supplies a current corresponding to the difference between the voltage at the source of the fourth transistor and the self-bias voltage to the source of the second transistor (12A).

Each of the first to $n^{th}$ detection units includes the fifth to eighth transistors as follows. The fifth and sixth transistors (11, 12) are of different conductive types, the respective drains are connected, and with the respective gates receiving one of the first to $n^{th}$ voltages, the fifth transistor and the sixth transistor output the voltage occurring at the respective drains as one of the first to $n^{th}$ voltage detection signals (Vo1 to Von). The seventh transistor (13) receives, at the gate, the self-bias voltage (Vsb), supplies a current corresponding to the difference between the voltage at the source of the seventh transistor and the self-bias voltage to the source of the fifth transistor (11). The eighth transistor (14) receives, at the gate, the self-bias voltage (Vsb), supplies a current corresponding to the difference between the voltage at the source of the eighth transistor and the self-bias voltage to the source of the sixth transistor (12).

Furthermore, the voltage detection circuit according to the invention includes at least one current source transistor (21, 22) that generates the operating current (IA) for operating the self-bias unit (SB, SB_A) and the first to $n^{th}$ detection units (U1 to Un, U1_A to Un_A).

In other words, the current source transistor receives at the gate the bias voltage (Vbn) and generates a drain current based on the difference between the voltage at the source and the bias voltage as the operating current (IA) that flows through the first to fourth transistors of the self-bias unit and the fifth to eighth transistors of each of the first to $n^{th}$ detection units.

With such configuration, in the voltage detection circuit according to the invention, since the operating current flowing through the self-bias unit and the first to $n^{th}$ detection units is generated by the current source transistor, the operating current can be limited to an arbitrary magnitude regardless of the voltage value of the main power voltage, and a stable detection operation with low current consumption can be realized. For example, in the case where the main power voltage (VDD) is high, it is possible to achieve a stable detection operation in which the transition of the logic value change of the voltage detection signal according to the change in the detection target voltage is steep for any reference voltage (Vref) within the range of the main power voltage and the power voltage (VSS).

Example 7

Figure 13:
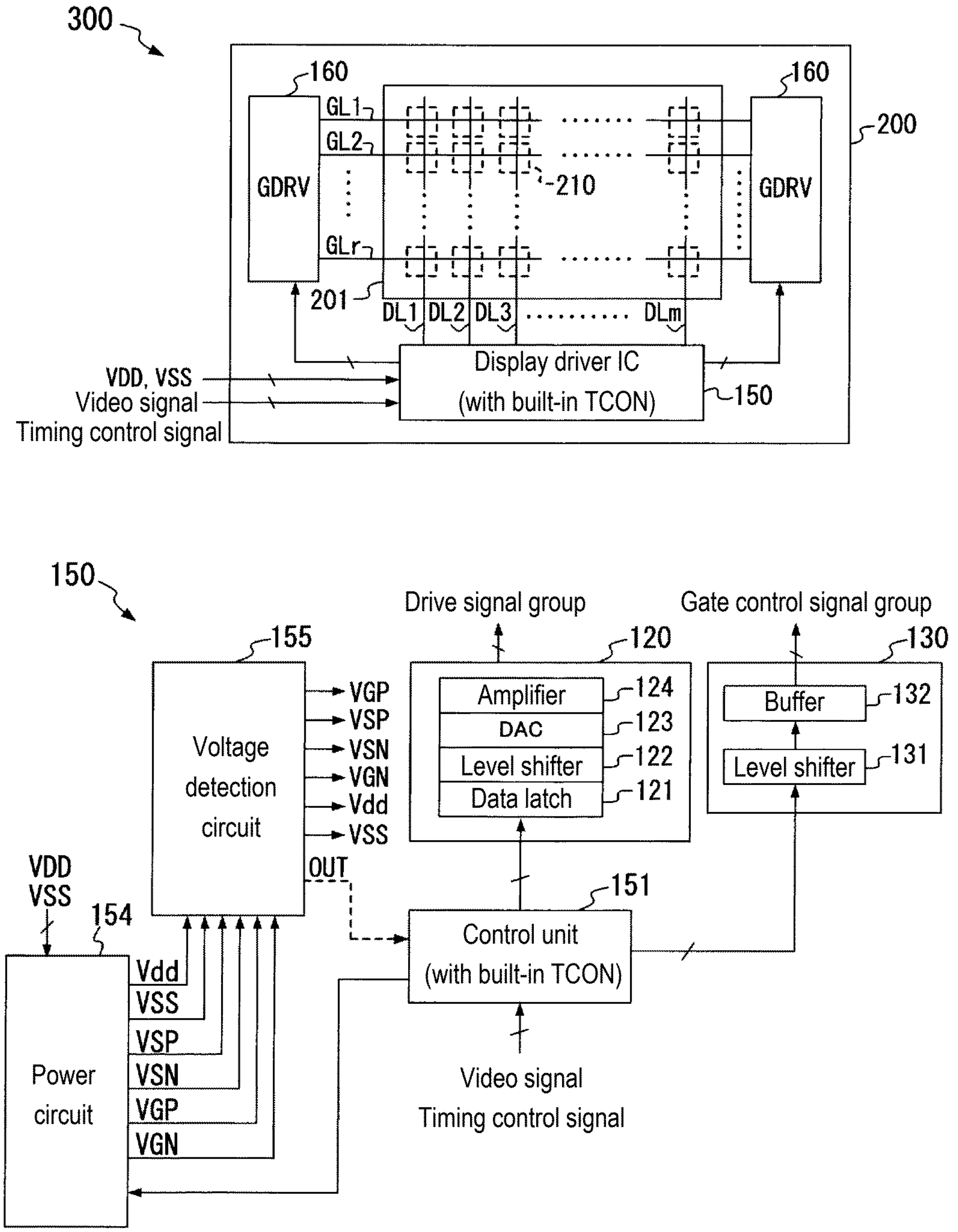
FIG. 13 is a block diagram showing the configuration of a display device 300 including a display driver IC 150 according to the seventh example.

FIG. 13 is a block diagram showing the configuration of a display device 300 including a display driver IC 150 according to the seventh example of the invention.

The display device 300 is formed by a display panel 200, a gate driver 160, and a display driver IC 150. The display panel 200 has a gate-in-panel (GIP) structure in which the gate driver 160 is integrally formed with gate lines, data lines, and a display part.

The display panel 200 includes gate lines GL1 to GLr (where r is an integer of 2 or more) wired in the horizontal direction on a display part 201 on an insulating substrate, such as a glass substrate or a plastic substrate, data lines DL1 to DLm (where m is an integer of 2 or more) wired in the vertical direction, and pixel cells 210 arranged at the intersections of the respective gate lines and data lines. In addition, the gate drivers 160 that output gate selection signals to the respective gate lines are disposed at both ends of the panel and are integrally formed with the pixel cells 210 as a thin film semiconductor circuit. The gate drivers 160 receive gate control signals supplied from the display driver IC 150 to generate the gate selection signals supplied to the respective gate lines GL1 to GLr, and sequentially output the gate selection signals to the respective gate lines.

The display driver IC 150 is formed by a semiconductor IC including a control unit 151 with a built-in timing controller, a data driver 120, a gate control circuit 130, a power circuit 154, and a voltage detection circuit 155. The display driver IC 150 is mounted on an end of the display panel 200 directly or via a film. Also, one or multiple display driver ICs 150 are mounted according to the resolution of the display panel. FIG. 7 shows a configuration example in which one display driver IC 150 is mounted.

The control unit 151 generates a timing signal indicating the timing of applying the gate selection signal to each of the gate lines GL1 to GLr based on an externally input video data signal or timing control signal, and supplies the timing signal to the gate control circuit 130.

In addition, the control unit 151 generates various control signals, including clock signals, load signals, etc., and video data signals, including a series of pixel data fragments representing the brightness levels of pixels in digital values, based on the externally input video data signal or timing control signal, and supplies the control signals and the video data signals to the data driver 153.

The gate control circuit 130 receives a timing signal supplied from the control unit 151, shifts the timing signal to a high level by using the level shifter 131, amplifies the shifted signal by using the buffer 132, outputs the amplified signal as a gate control signal from the display driver IC 150, and supplies the gate control signal to the gate drivers 160 formed at both ends of the display panel 200.

The data driver 120 includes a data latch 121, a level shifter 122, a digital-to-analog (DA) conversion unit (DAC) 123, and an amplifier 124. The data latch 121 captures respective pixel data fragments included in the video data signal one horizontal scanning line at a time (m pieces), and supplies the captured m pixel data fragments to the level shifter 122. The level shifter 122 supplies m pixel data fragments, the signal levels of the m pixel data fragments being shifted to a high level, to the DA conversion unit 123. The DA conversion unit 123 individually converts each of the m pixel data fragments into a gradation voltage signal having an analog voltage value corresponding to the brightness level indicated by each pixel data fragment. The DA conversion unit 123 supplies the m gradation voltage signals obtained through conversion to the amplifier 124. The amplifier 124 individually amplifies the m gradation voltage signals and supplies the amplified signal as a drive signal to each of the data lines DL1 to DLm of the display panel 200. The power circuit 154 receives the externally supplied main power voltage VDD and power voltage VSS (for example, zero volts), and generates a power voltage Vdd for logic circuits based on the main power voltage VDD. Additionally, the power circuit 154 generates a positive electrode source power voltage VSP of positive polarity and a negative electrode source power voltage VSN of negative polarity as a power source for the data driver 120. Furthermore, the power circuit 154 generates a positive electrode gate power voltage VGP of positive polarity and a negative electrode gate power voltage VGN of negative polarity as a power source for the gate control circuit 130, which turn ON and OFF the thin film transistors included in the pixel cells 210 of the display panel 200.

The power circuit 154 supplies the power voltage Vdd and the power voltage VSS to the control unit 151.

Additionally, the power circuit 154 supplies the positive electrode gate power voltage VGP and the negative electrode gate power voltage VGN to the gate control circuit 130, and supplies the power voltage VSS, the positive electrode source power voltage VSP, and the negative electrode source power voltage VSN to the data driver 120.

Furthermore, the power circuit 154 supplies the power voltage Vdd, the power voltage VSS, the positive electrode source power voltage VSP, the negative electrode source power voltage VSN, the positive electrode gate power voltage VGP, and the negative electrode gate power voltage VGN to the voltage detection circuit 155.

The voltage detection circuit 155 includes, for example, the voltage detection circuit 100_6 shown in FIG. 12. At this time, the voltage detection circuit 155 individually receives the power voltage Vdd, the positive electrode gate power voltage VGP, the positive electrode source power voltage VSP, the negative electrode source power voltage VSN, and the negative electrode gate power voltage VGN at one end of each of the resistor strings LD1 to LD5 included in the voltage detection circuit 100_6.

Additionally, the voltage detection circuit 155 may include the voltage detection circuit 100_5 shown in FIG. 11. At this time, the voltage detection circuit 155 may adopt, as the voltage detection circuit 100_5, one that is provided with five resistor strings LD that individually receive the power voltage Vdd, the positive electrode gate power voltage VGP, the positive electrode source power voltage VSP, the negative electrode source power voltage VSN, and the negative electrode gate power voltage VGN. At this time, five sets of detection units U1 to Un are prepared to respectively correspond to the five resistor strings LD. In addition, the voltage detection circuit 155 may include five resistor strings LD that respectively correspond to the five power supply voltages, and five voltage detection circuits 100_5 may be provided for each of the five resistor strings LD.

As a result, the detection units U1 to U5 included in the voltage detection circuit 100_5 or 100_6 have, for each of the power voltage Vdd, the positive electrode gate power voltage VGP, the positive electrode source power voltage VSP, the negative electrode source power voltage VSN, and the negative electrode gate power voltage VGN, a voltage group obtained by dividing each power voltage at an individual ratio, and output the voltage detection signals Vo1 to Vo5 indicating whether each of the voltage values of the voltage-divided voltage groups is higher than the reference voltage Vref.

Here, in the voltage detection circuit 155, the groups of voltages obtained by dividing, at individual ratios, the power voltage Vdd, the positive electrode gate power voltage VGP, the positive electrode source power voltage VSP, the negative electrode source power voltage VSN, and the negative electrode gate power voltage VGN are divided into a power voltage group determined to have a voltage abnormality when the voltage value is higher than the reference voltage Vref, and a power voltage group determined to have a voltage abnormality when the voltage value is equal to or lower than the reference voltage Vref.

At this time, in the case of determining that a voltage abnormality has occurred in at least one of the positive electrode gate power voltage VGP, the positive electrode source power voltage VSP, the negative electrode source power voltage VSN, and the negative electrode gate power voltage VGN based on the voltage detection signals Vo1 to Vo5, the voltage detection circuit 155 supplies a voltage abnormality detection signal OUT to the control unit 151 indicating that a power voltage abnormality has occurred.

In the case of receiving such voltage abnormality detection signal OUT, the control unit 151 instructs the gate control circuit 130 to output a gate control signal that sets the operation of the gate driver 160 to an inactive state, and also sets the operation of the data driver 120 to an inactive state. Accordingly, it is possible to prevent damage or abnormal display associated with power voltage abnormalities. Furthermore, in the case of receiving the voltage abnormality detection signal OUT, the control unit 151 may also exert control to stop the operation of the power circuit 154.

Additionally, in the voltage detection circuit 155, the voltage detection may also be performed for various voltages generated by internal regulators or other external power sources, in addition to the voltages (Vdd, VGP, VSP, VSN, VGN).

As described above, the voltage detection circuit according to the embodiment includes the self-bias unit that generates the self-bias voltage based on the reference voltage, and the first to $n^{th}$ detection units that receive the self-bias voltage and individually detect whether each of the first to $n^{th}$ voltages that are the detection targets is higher than the reference voltage. The voltage detection circuit includes the current source transistor that generates the operating current for operating the self-bias unit and the first to $n^{th}$ detection units, and supplies the operating current to the self-bias unit and the first to $n^{th}$ detection units. This makes it possible to reduce static current consumption even when the power voltage for operating the self-bias unit and the first to $n^{th}$ detection units is a high voltage, thereby making it possible to suppress power consumption.

What is claimed is:

1. A voltage detection circuit, provided for comparing magnitudes of a reference voltage and each of first to $n^{th}$ voltages, n being an integer of 2 or more, and outputting first to $n^{th}$ voltage detection signals indicating whether the respective first to $n^{th}$ voltages are higher than the reference voltage, wherein the voltage detection circuit comprises:

a self-bias unit, receiving the reference voltage, and generating a self-bias voltage based on the reference voltage; and first to $n^{th}$ detection units, individually receiving the first to $n^{th}$ voltages, and individually outputting the first to $n^{th}$ voltage detection signals, the self-bias unit comprises:

a first transistor and a second transistor, having mutually different conductive types, wherein respective drains of the first and second transistors are connected with each other via a first node, and the first and second transistors generate, as the self-bias voltage, a voltage occurring at the first node by receiving the reference voltage at respective gates of the first and second transistors;

a third transistor, receiving, at a gate of the third transistor, the self-bias voltage, and supplying a current corresponding to a difference between a voltage at a source of the third transistor and the self-bias voltage to a source of the first transistor; and a fourth transistor, receiving, at a gate of the fourth transistor, the self-bias voltage, and supplying a current corresponding to a difference between a voltage at a source of the fourth transistor and the self-bias voltage to a source of the second transistor, each of the first to $n^{th}$ detection unit comprises:

a fifth transistor and a sixth transistor, having mutually different conductive types, wherein respective drains of the fifth and sixth transistors are connected, and, with respective gates of the fifth and sixth transistors receiving one of the first to $n^{th}$ voltages, the fifth and sixth transistors output a voltage generated at the respective drains as one of the first to $n^{th}$ voltage detection signals;

a seventh transistor, receiving, at a gate of the seventh transistor, the self-bias voltage, and supplying a current corresponding to a difference between a voltage at a source of the seventh transistor and the self-bias voltage to a source of the fifth transistor; and an eighth transistor, receiving, at a gate of the eighth transistor, the self-bias voltage, and supplying a current corresponding to a difference between a voltage at a source of the eighth transistor and the self-bias voltage to a source of the sixth transistor, and the voltage detection circuit further comprises:

at least one current source transistor, receiving a bias voltage at a gate of the current source transistor, and generating a drain current based on a difference between a voltage of a source of the current source transistor and the bias voltage as an operating current that flows through the first to fourth transistors of the self-bias unit and the fifth to eighth transistors of each of the first to $n^{th}$ detection units.

2. The voltage detection circuit as claimed in claim 1, wherein the source of the third transistor of the self-bias unit and the source of the seventh transistor of each of the first to $n^{th}$ detection units are jointly connected via a third node, the source of the fourth transistor of the self-bias unit and the source of the eighth transistor of each of the first to $n^{th}$ detection units are jointly connected via a fourth node, the source of the current source transistor receives a first power voltage, and a drain of the current source transistor is connected with one of the third node and the fourth node, and an other of the third node and the fourth node is supplied with a second power voltage having a voltage value different from that of the first power voltage.

3. The voltage detection circuit as claimed in claim 2, wherein the reference voltage is set within a voltage range between the first power voltage and the second power voltage, and is set to a voltage on a side close to the first power voltage to which the current source transistor is connected.

4. The voltage detection circuit as claimed in claim 1, further comprising: first to $n^{th}$ inverter circuits, individually receiving the first to $n^{th}$ voltage detection signals, and outputting n voltage detection signals in which logic values indicated by the first to $n^{th}$ voltage detection signals are inverted, wherein in each of the first to $n^{th}$ inverter circuits, a transistor limiting the operating current on a current path is inserted.

5. The voltage detection circuit as claimed in claim 1, comprising:

a spare detection unit, receiving a spare detection voltage having a voltage value higher or lower than any of the first to $n^{th}$ voltages, comparing magnitudes of the reference voltage and the spare detection voltage, and outputting a spare voltage detection signal indicating whether the spare detection voltage is higher than the reference voltage; and a current control circuit, comprising the current source transistor and receiving the spare voltage detection signal, wherein the current control circuit changes the operating current flowing through the first to fourth transistors of the self-bias unit and the fifth to eighth transistors of each of the first to $n^{th}$ detection units at a time when a logic value of the spare voltage detection signal changes.

6. The voltage detection circuit as claimed in claim 5, wherein, at the time when the logic value of the spare voltage detection signal changes, the current control circuit changes the bias voltage supplied to the gate of the current source transistor, and changes the operating current flowing through the first to fourth transistors of the self-bias unit and the fifth to eighth transistors of each of the first to $n^{th}$ detection units.

7. The voltage detection circuit as claimed in claim 5, wherein the current control circuit further comprises: another current source transistor, connected in parallel with the current source transistor; and a control means, controlling activation and deactivation of the another current source transistor, and the current control circuit switches the activation and deactivation of the another current source transistor when the logic value of the spare voltage detection signal changes, and, when the another current source transistor is controlled to activation, supplies a total current obtained by adding a current flowing through the another current source transistor to a current flowing through the current source transistor as the operating current flowing through the first to fourth transistors of the self-bias unit and the fifth to eighth transistors of each of the first to $n^{th}$ detection units.

8. The voltage detection circuit as claimed in claim 5, wherein the spare detection unit comprises:

a ninth transistor and a tenth transistor, having mutually different conductive types, wherein respective drains of the ninth and tenth transistors are connected, and, with respective gates of the ninth and tenth transistors receiving the spare detection voltage, the ninth and tenth transistors output a voltage generated at the respective drains as the spare voltage detection signal;

an eleventh transistor, receiving, at a gate of the eleventh transistor, the self-bias voltage, and supplying a current corresponding to a difference between a voltage at a source of the eleventh transistor and the self-bias voltage to a source of the ninth transistor;

a twelfth transistor, receiving, at a gate of the twelfth transistor, the self-bias voltage, and supplying a current corresponding to a difference between a voltage at a source of the twelfth transistor and the self-bias voltage to a source of the tenth transistor, and the operating current flowing through the ninth to twelfth transistors of the spare detection unit is controlled by the current control circuit together with the operating current flowing through the first to fourth transistors of the self-bias unit and the fifth to eighth transistors of each of the first to $n^{th}$ detection units.

9. The voltage detection circuit as claimed in claim 1, wherein a W/L size ratio of the seventh transistor comprised in each of the first to $n^{th}$ detection units and receiving, at the gate of the seventh transistor, the self-bias voltage is different from a W/L size ratio of the third transistor comprised in the self-bias unit and receiving, at the gate of the third transistor, the self-bias voltage.

10. A voltage detection circuit, detecting, in n stages, a magnitude of a power voltage as a detection target, wherein n is an integer of 2 or more and the voltage detection circuit comprises:

the self-bias unit and the first to $n^{th}$ detection units as claimed in claim 1; and a resistor string, generating the first to $n^{th}$ voltages whose voltage values are different by dividing the power voltage serving as the detection target into n voltages, wherein a logic value of each of the first to $n^{th}$ voltage detection signals output from the first to $n^{th}$ detection units indicates a magnitude of a change of the power voltage serving as the detection target.

11. A display driver, driving a display panel in which a plurality of data lines and a plurality of gate lines are disposed to intersect, the display driver comprising:

a data driver, generating a plurality of drive signals based on a video signal and supplying the drive signals to the data lines;

a gate driver, supplying a gate selection signal to each of the gate lines;

a power circuit, generating a plurality of power voltages used by the data driver and the gate driver;

the voltage detection circuit as claimed in claim 10 for detecting at least one of the plurality of power voltages; and a control unit, determining whether a voltage abnormality occurs in the power voltages based on the first to $n^{th}$ voltage detection signals output from the voltage detection circuit, and stopping an operation of the data driver and the gate driver in a case where it is determined that the voltage abnormality occurs.

12. A display device, comprising: a display panel, in which a plurality of data lines and a plurality of gate lines are disposed to intersect; and a display driver, driving the display panel wherein the display panel comprises:

a data driver, generating a plurality of drive signals based on a video signal and supplying the drive signals to the data lines;

a gate driver, supplying a gate selection signal to each of the gate lines;

a power circuit, generating a plurality of power voltages used by the data driver and the gate driver;

the voltage detection circuit as claimed in claim 10 for detecting at least one of the plurality of power supply voltages; and a control unit, determining whether a voltage abnormality occurs in the power voltage based on the first to $n^{th}$ voltage detection signals output from the voltage detection circuit, and stopping an operation of the data driver and the gate driver in a case where it is determined that the voltage abnormality occurs.

13. The voltage detection circuit as claimed in claim 1, comprising: first to $n^{th}$ resistor strings individually receiving first to $n^{th}$ power voltages as a detection target, and generating, as first to $n^{th}$ voltages, voltages obtained by respectively dividing the received power voltages.

* * * * *